(12) United States Patent
Buhler et al.

(10) Patent No.: US 8,008,639 B2
(45) Date of Patent: Aug. 30, 2011

(54) SYSTEM FOR PROCESSING AN OBJECT

(75) Inventors: Wolfram Buhler, Hermaringen (DE);
Alexander Rosenthal, Aalen (DE);
Camille Stebler, Fehren (CH);
Emmerich Bertagnolli, Vienna (AT);
Heinz Wanzenbock, Vienna (AT)

(73) Assignee: Carl Zeiss NTS GmbH (DE)

( * ) Notice: Subject to any disclaimer, the term of this patent is extended or adjusted under 35 U.S.C. 154(b) by 356 days.

(21) Appl. No.: 12/268,822

(22) Filed: Nov. 11, 2008

(65) Prior Publication Data
US 2009/0152460 A1 Jun. 18, 2009

(30) Foreign Application Priority Data

Nov. 13, 2007 (DE) .................. 10 2007 054 074

(51) Int. Cl.
*H01J 37/317* (2006.01)
*G03F 7/20* (2006.01)

(52) U.S. Cl. ............... 250/492.3; 250/306; 250/310; 250/397; 250/398; 250/493.1

(58) Field of Classification Search .......... 250/306, 250/310, 397, 398, 492.21, 492.3, 493.1
See application file for complete search history.

(56) References Cited

U.S. PATENT DOCUMENTS

| | | | |
|---|---|---|---|
| 5,055,696 A * | 10/1991 | Haraichi et al. .......... 250/492.2 |
| 5,149,974 A | 9/1992 | Kirch et al. |
| 5,645,897 A | 7/1997 | Andra |
| 5,683,547 A | 11/1997 | Azuma et al. |
| 7,170,068 B2 * | 1/2007 | Petrov et al. .......... 250/398 |
| 7,435,973 B2 * | 10/2008 | Koops et al. .......... 250/441.11 |
| 7,592,604 B2 * | 9/2009 | Koike et al. .......... 250/398 |
| 7,692,163 B2 * | 4/2010 | Nagano .......... 250/492.2 |
| 2005/0103272 A1 * | 5/2005 | Koops et al. .......... 118/723 EB |
| 2005/0211925 A1 * | 9/2005 | Nakasuji et al. ........ 250/492.21 |
| 2006/0255288 A1 * | 11/2006 | Petrov et al. .......... 250/398 |
| 2006/0284090 A1 * | 12/2006 | Koops et al. .......... 250/310 |
| 2007/0246651 A1 * | 10/2007 | Koike et al. .......... 250/310 |
| 2008/0067437 A1 | 3/2008 | Okunuki et al. |
| 2009/0152459 A1 * | 6/2009 | Buhler et al. .......... 250/306 |
| 2009/0152460 A1 * | 6/2009 | Buhler et al. .......... 250/306 |

FOREIGN PATENT DOCUMENTS

| | | |
|---|---|---|
| DE | 4204650 C1 | 7/1993 |
| DE | 10208043 A1 | 3/2009 |
| EP | 0452969 A2 | 10/1991 |
| JP | 2007/231324 A | 9/2007 |
| WO | 2006/031104 A1 | 3/2006 |

OTHER PUBLICATIONS

Taraschi, G. et al., "Strained Si, SiGe, and Ge On-Insulator: Review of Wafer Bonding Fabrication Techniques," Solid State Electronics, 48(8), 1297-1305, 2004.
European Search Report in corresponding EP Application No. 08019758.5.

* cited by examiner

*Primary Examiner* — David A Vanore
(74) *Attorney, Agent, or Firm* — Potomac Patent Group PLLC

(57) ABSTRACT

A processing system comprises a gas supply apparatus with which process gas is supplied to an object. An activation beam activates the gas thereby inducing a chemical reaction between material at the surface of the object and the process gas causing ablation of material from the surface or deposition of material at the surface. The gas supply apparatus is formed from a stack of plates providing a gas conduit system between at least one gas inlet and at least one gas outlet.

28 Claims, 17 Drawing Sheets

Figure 1:
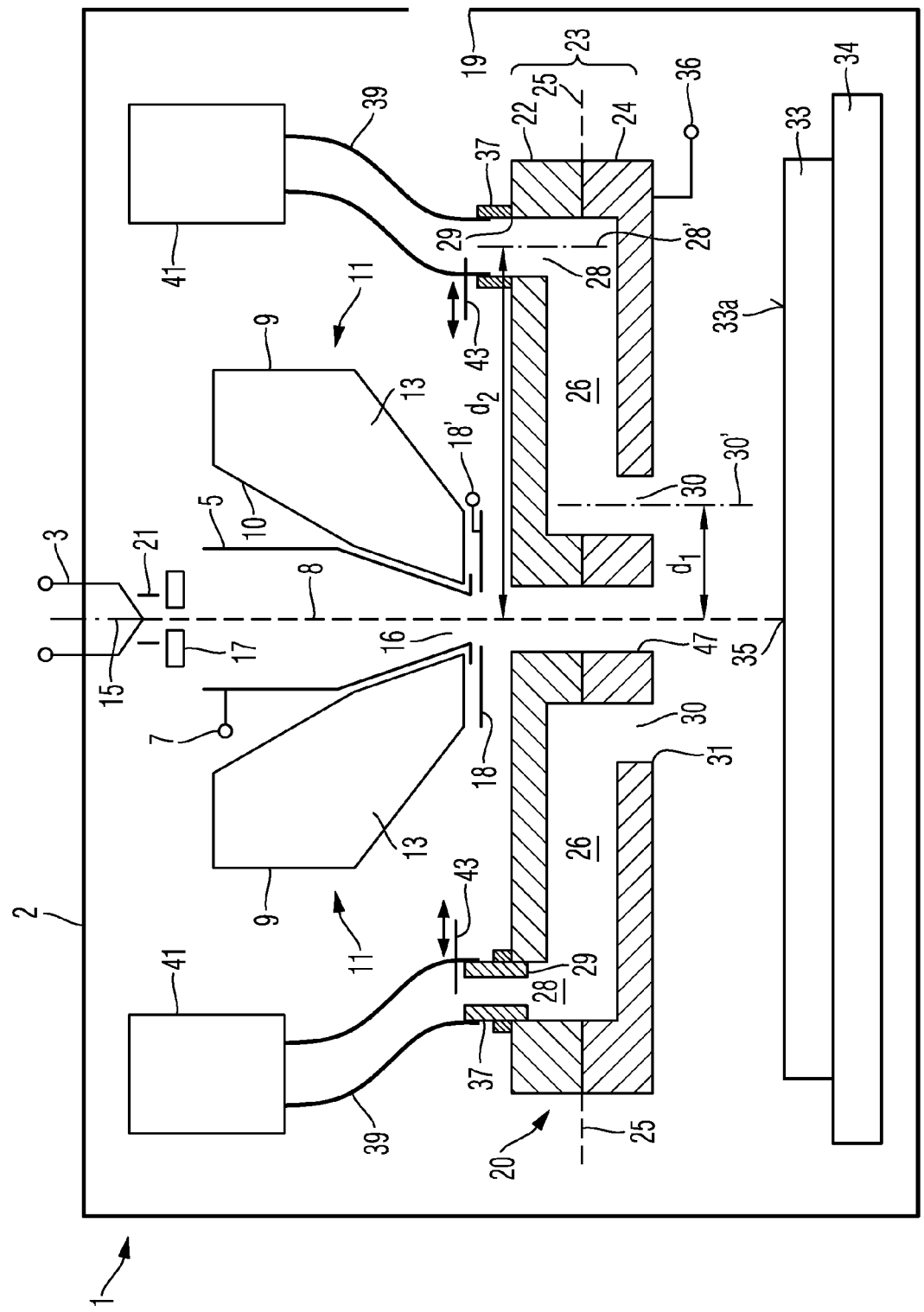

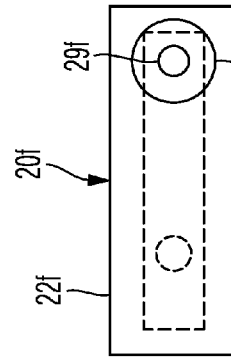
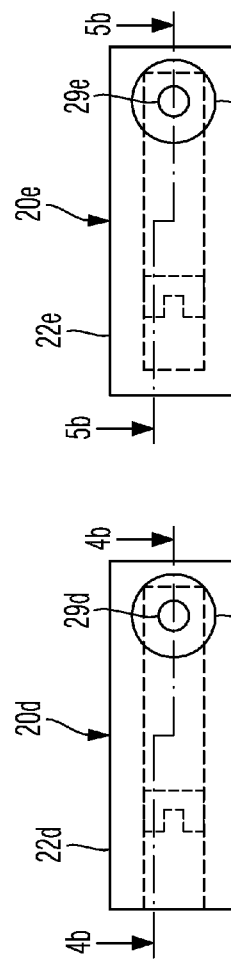
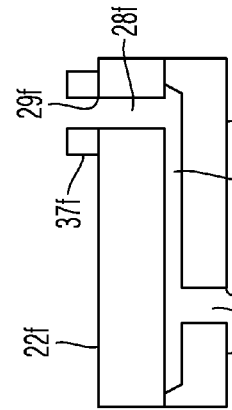
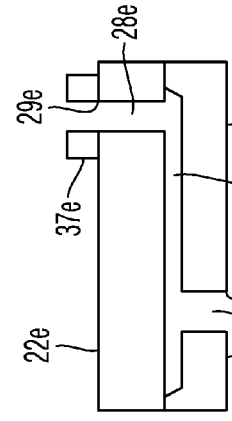
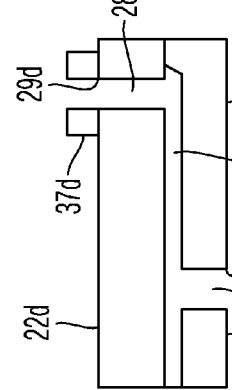
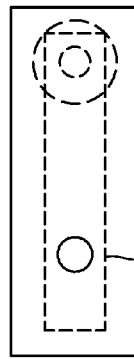
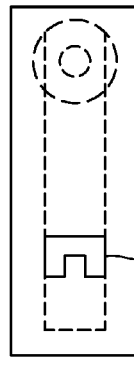
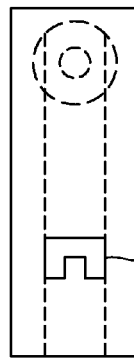
Fig. 6a  Fig. 5a  Fig. 4a
Fig. 6b  Fig. 5b  Fig. 4b
Fig. 6c  Fig. 5c  Fig. 4c

SYSTEM FOR PROCESSING AN OBJECT

RELATED APPLICATIONS

This application claims priority and benefit from German Patent Application No. 10 2007 054 074.6, filed Nov. 13, 2007, the entire teachings of which are incorporated herein by reference.

The present invention relates to a system for processing an object.

In particular, this invention relates to a system for processing an object, wherein the system is designed to perform depositions or ablations at predetermined locations of the surface of the object. Further in particular the present invention relates to a system for processing a surface of an object, wherein the system comprises a gas supply apparatus formed by a plate structure.

From the state of the art processing systems are known comprising a gas supply system for supplying gas to a surface of an object to be processed, as well as a beam source and a beam optics for directing an activation beam to a location of the surface of the object. The gas supply apparatus is designed to supply a particular gas to a to be processed portion of the surface of the object. The activation beam which may be an electron beam, an ion beam, or a photon beam, may finely be focussed at a to be processed location of the surface of the object. Gas molecules present in this portion having been supplied by the gas supply apparatus are activated upon interacting with the activation beam, that means they are set into an exited state or they are set in rotation, oscillation and/or vibration states so that their chemical reactivity is changed. Thereby, also radicals may be formed. Gas molecules adsorbing at the surface of the object having been activated due to the interaction with the activation beam, for example by primary and/or secondary electrons, then react either by themselves (for example induced degradation of a molecule without interaction with the surface of the object) or react with elements of molecules present at the surface of the object. Depending on the used reaction gas and substrate atoms, elements or molecules present at the surface of the object this may lead to ablations of material from the surface of the object or to depositions of material at the surface of the object. Due to the possibility of finely focussing the activation beam, in particular a particle beam, such as an electron beam or an ion beam, the described method may in particular advantagely employed for generating and processing micro structures.

From DE 102 08 043 A1 for example a material processing system is known, wherein an electron beam activates a gas supplied by a gas supply arrangement at the surface of the object to cause deposition or ablation of material. A processing progress may thereby be monitored by acquiring an electron microscopic image. The gas is thereby supplied via gas nozzles arranged at an end of a gas cannula transversely oriented relative to the object. It became appearent that conventional gas supply systems are difficultly to combine with an optics of an activation beam and/or an analysis beam.

Thus it is an object of the present invention to provide a processing system diminishing the above mentioned problems. In particular, it is an object of the present invention to provide a material processing system capable of inducing a local reaction of a reaction gas alone or a local reaction of several reaction gases with each other at the surface or with the surface of the object using an activation beam which system concurrently enables a reliable analyses of the processing state using an analyses beam.

According to an embodiment of the present invention a system for processing an object is provided comprising a gas supply apparatus for supplying gas to the object; a beam source for generating at least one activation beam for activating the gas; and a beam optics for directing the at least one activation beam to the object. Thereby, the gas supply apparatus comprises a stack of a plurality of plates being adjoined with their flat sides extending transverse to a beam direction of the activation beam, wherein the stack of plates allows a traversal of the activation beam towards the object and wherein the stack of plates comprises at least one gas inlet and at least one gas outlet which gas outlet is arranged in a flat side of a plate of the stack arranged closest to the to be processed object. The flat side thereby may substantially be plane or, in other embodiments, may be structured at its surface by protruding or recessing portions.

The gas inlet and the gas outlet are connected with each other by a gas conduit system formed within the stack which gas conduit system comprises at least one conduit section extending from a location in the stack remote from a location of the traversal of the activation beam to a location close to the location of the traversal of the activation beam. In embodiments this conduit section may be provided with special elements, such as mixers, valves, heating elements, cooling elements, or sensors.

Thereby, the stack plates may also be adapted for discharging gas or undesired gaseous reaction procucts from a space between the stack of plates and the surface of the object.

The activating the gas thereby comprises for example ionising, generating an exited state of the gas and the like. In general, the gas is set in a energetically higher state than at the time of entering into the stack of plates. A preactivating may thereby also be performed within the stack of plates, such as by heating using heating elements. The activated gas may, due to the interaction with the activation beam, either chemically react with itself or with material at a surface of the object causing a modification of the surface. The modification may comprise ablation of material from the surface and/or deposition of material onto the surface or may also comprise a compensation of charges at the surface.

The beam optics may comprise optical lens systems, mirrors and diffraction elements in the case the activation beam comprises a photon beam, in particular a light beam. The beam optics may comprise electrical deflection elements and magnetic and electrostatic lenses, in the case the activation beam comprises a charges particle beam, in particular an ion beam or an electron beam.

The flat side of the plate is the side of the plate lying in a plane of a maximal extension of the plate. A side substantially orthogonal to the flat side is denoted as a face side of the plate or a face side of the stack. The plates may be adjoined in a flat manner and may be connected with each other. The connection may be caused by mechanical connection elements, such as screws, bolts, or pins. Also, the connection may be caused by thermal treatment, such as welding, soldering, sintering, or melting, or may be caused by an adhesive applied to opposing flat sides or by wafer bonding. Background information about wafer bonding may be taken from the article "Strained Si, SiGe, and Ge on-insulator: review of wafer bonding fabrication techniques" from Taraschi G et al., SOLID-STATE ELECTRONICS 48 (8), 1297-1305, 2004.

The activation beam may transversely, in particular substantially orthogonally, traverse through the stack. Thereby, a photon beam may traverse through an optically transparent window. A partical beam may traverse through a through hole.

The conduit section inside the stack of plates may have different cross sectional shapes that may change along the direction of extension. The conduit section may have a cross sectional shape, such as a circle, a semi-circle, a rectanlge, or a trapezoid across a portion of its length or across its entire length. A cross sectional size and shape of the conduit along the conduit section of the gas supply apparatus thereby is designed according to flow technical requirements.

According to an embodiment of the present invention a ratio of a length of the conduit section and a thickness of the stack is greater than 4, in particular greater than 10. The thickness of the stack thereby is an extension of a face side of the stack substantially perpendicular to flat sides of the plates forming the stack.

According to an embodiment of the present invention the stack comprises a first plate and a second plate delimiting the conduit section across its entire length. Thereby, the conduit section may extends substantially parallel to the flat side of both plates, respectively.

In other embodiments the stack is formed by three adjoining plates, wherein a conduit section is formed by a first pair of adjoining plates and a further conduit section is formed by a second pair of adjoining plates, wherein conduit sections within the stack are connected to each other or lead to separate gas outlets. Thus, conduit sections may be formed in different levels of the stack.

According to an embodiment of the present invention the gas inlet is arranged in a flat side of a plate of the stack arranged farthest from the object. Thereby, gas may be supplied from the flat side into the conduit system of the stack.

According to an embodiment of the present invention the gas inlet is arranged in a face side of the stack. As mentioned above, a face side of the stack is understood to be a side of the stack substantially extending perpendicular to the flat side of the plates forming the stack.

According to an embodiment of the present invention the gas supply apparatus comprises a plurality of gas inlets to allow supplying plural different gases to the object.

According to an embodiment of the present invention the gas supply apparatus comprises a plurality of gas outlets to separately supply the plural different gases to the object. Thus, complex chemical reactions may be performed at the surface of the object to process the surface.

According to an embodiment of the present invention the gas supply apparatus comprises a plurality of gas outlets being connected through the gas conduit system to a common gas inlet. Thereby, a widely homogeneous distribution of the gas in proximity of the surface of the object may be achieved.

According to an embodiment of the present invention the beam source is adapted for generating a plurality of activation beams and the beam optics is adapted to direct the plural activation beams to locations on the object arranged spaced apart from each other. Thus it is possible to process or inspect plural locations simultaneously. Herein one outlet of the gas supply apparatus may be associated with plural activation beams.

According to an embodiment of the present invention a number of the gas outlets being connected through the gas conduit system to a common gas inlet is greater than or equal to the number of the activation beams.

According to an embodiment of the present invention the at least one activation beam comprises at least one of an electron beam, an ion beam, and a photon beam.

According to an embodiment of the present invention the system comprises at least one ion detector or photon detector to detect ions or photons released from the object by the activation beam.

According to an embodiment of the present invention the system comprises at least one electron detector to detect electrons released from the object by the activation beam.

According to an embodiment of the present invention the beam optics comprises an objective for focussing the activation beam onto the object.

According to an embodiment of the present invention the beam optics comprises a beam deflector to scan the activation beam across the object.

Thereby the system according to an embodiment to the present invention comprises a scanning electron microscope.

In other embodiments the system comprises an ion beam apparatus for generating and directively deflecting a focussed ion beam as well as for detecting particles or photons released from the object by the ion beam.

According to an embodiment of the present invention a plate of the stack being arranged closest to the surface of the object or being arranged opposite therefrom comprises a electrically conductive surface and the electrically conductive surface is electrically connected to a predetermined potential. Thereby it is enabled to apply an appropriate voltage between the object and/or a beam tube of a charged particle activation beam and the stack to cause charged particles, in particular electrons, released from the object reaching the detector, in particular electron detector, to thus allow inspecting the surface of the object. Thus, an imaging quality may be improved. Further, undesired chargings interfering with imaging and also with processing may be prohibited. Electrically conductive materials may also be arranged inside the stack or on a side of the stack averted from the to be processed surface of the object and may electrically be connected to voltage sources.

The processing system may comprise a vacuum vessel in which the gas supply apparatus, the beam source, the beam optics, and the detector, in particular electron detector, are arranged.

According to an embodiment of the present invention the system comprises at least one substance reservoir being connected with the at least one gas inlet of the stack in a gas conducting manner. The substance reservoir thereby may be contained within the vacuum vessel. Depending on the embodiment however it may also be arranged outside the vacuum vessel. Also one or more mechanical, pneumatical or electrical valves may be provided between the reservoir and the gas outlet.

According to an embodiment of the present invention the substance reservoir contains a precursor gas, in particular organyles, metal organyles, oxygene containing compounds, nitrogen containing compounds, organic compounds, inorganic compounds, halogenid containing compounds or a combination therefrom.

Further, the substance reservoir may contain tungsten fluorid, aluminium chloride, titan chloride, titan fluorid, an inorganic gold precursor or other metal chlorides or metal fluorides.

According to an embodiment of the present invention the substance reservoir contains a purge gas, in particular an inert gas, such as He, Ne, Ar, Xe, Kr or/and $N_2$.

According to an embodiment of the present invention the gas supply apparatus further comprises a tempering apparatus within the stack of plates for cooling and/or heating of gas present in the gas conduit system. Thus, gas may be brought to a desired temperature before supplying it to the surface of the object.

According to an embodiment of the present invention the gas supply apparatus comprises at least two gas inlets and further a mixer within the stack of plates for mixing two different gases entering through the at least two gas inlets into the gas conduit system. Thus, a gas mixture appropriate for processing the surface of the object may be provided immediately before supplying the gas mixture to the surface of the object.

According to an embodiment of the present invention the gas supply apparatus further comprises within the stack of plates a pressure sensor for measuring a pressure of gas contained within the gas conduit system.

An application field resides in manufacturing or processing of stamps for the (nano)-imprint-lithography. A further application field resides in processing of masks for the optical lithography for manufacturing integrated circuits in the semi-conductor industry. A mask structure thereby is imaged to a wafer using an illumination optics and an objective, wherein the wafer is provided with a photo sensitive resist. Thereby, the mask structures are imaged onto the wafer in a dimagnified way. A lithography mask typically exhibits very fine structures to allow a correspondingly fine structuring of a wafer and thus a high integration density of circuits in the end product. Therefore, high demands are requested for the structure quality of the mask structures which also holds for the imprint-lithography. This high structure quality is not achievable by conventional manufacturing methods of such lithography masks. Therefore, lithography masks are postprocessed to provide the required structure quality of the mask structures. Thereby, advantageously the described processing system is employed. A mask is then used for manufacturing a plurality of highly integrated semi-conductor components. In the future multi-beam systems for processing objects are to be expected (for example Mapper-lithography) for which conventional gas supply systems comprising pipe conducts and cannulas are not employable.

The inventive material processing system may advantageously used for reparing masks for lithography. Thereby, also two different beam types, for example an ion beam and an electron beam, may be generated. In particular, the inventive material processing system may be used for "Direct-writing" of microstructures. A large-area-fine-structuring of surfaces with structure sizes in the nanometer range is possible with the inventive system. As reaction gases advantageously precurser substances or precursors may be utilized that cause material deposition or edging the substrate material not until activation by energetic particles (photons, electrons, ions, molecules, cluster and the like). Thereby, the reactive precurser substances are guided via the inventive gas conduit and nozzle system directly to the surface of the substrate. The reaction gases may be supplied, mixed and distributed in a controlled manner during the direct write process. By the thus enabled direct writing three-dimensional structures may be manufactured. Metals and also isolators may be deposited.

The gas supply system according to the present invention may be performed on the basis of microstructuring techniques. The gas supply to the surface of the to be processed object is ideally performed at plural locations to ensure a homogeneous distribution of the precursor substances.

The inventive processing system can not only be used for direct writing of nanostructures, but may also be used for surface modification, surface finishing, and for modification of existing micro- and nanostructures. Thereby it is possible to supply precursor substances at plural positions. When different precursor substances are supplied, locally performing complex chemical processes at the surface of the object is enabled. The manufacturing nanostructures performable with the inventive direct writing system is performed by chemical processes by supply of one of the plural metal compounds, in particular non-organic metal precursors or metal organyles, and their degradation into solid metal deposits; by supply of degradable organyls of different compounds together with a highly oxygen containing compound and its degradation to solid oxyde deposites; by supply of organyles of different compounds together with a highly nitrogen containing compound and its degradation to nitrite deposites; by supply of organic compounds and their degradation to carbon deposites; by supply of volatile inorganic or organic compounds and their degradation upon local deposition of one or more of the contained elements; by supply of halogenide containing compounds and their degradation into reactive halogene components locally etching the substrate material; by supply of oxygene containing compounds and their local release from oxygene components, locally oxydising the substrate material; by supply of nitrogen containing compounds and their local release of nitrogen components, causing local reaction of the substrate material with nitrogen; and by supply of volatile inorganic or organic compounds and their degradation upon local reaction with the sample surface.

By the inventive material processing system an almost homogeneous gas concentration is maintained at the surface of the object during processing the object. Thereby, a pressure in a range from for example 10 mbar to $10^{-6}$ mbar, in particular $10^{-3}$ mbar to $10^{-5}$ mbar, further in particular about $10^{-4}$ mbar, may prevail.

The plates of the gas supply system may thereby be made of silicon or silicon oxide being optically transparent. Thereon, a conductive layer may be attached to enable applying an appropriate potential to the gas supply apparatus, when a charged particle beam, in particular an electron beam, is used as activation beam or analysis beam. In a processing method for processing a surface of an object thereby a laminar gas flow may be generated within a conduit system of the gas supply system, while between the gas outlet(s) of the gas supply system and the surface of the object non-laminar flow occurs but the gas behaves as a molecular beam.

The gas outlets of the gas supply apparatus may have in its cross section or longitudinal section different shapes, such as a slit shape, a half-moon shape, a circular shape or the like. The channels or pipes within the gas supply system may have different widths or may have different cross sectional sizes along a flow direction of the gas. In the gas conduit system of the inventive gas supply system a pressure from 0.01 to 10 mbar, in particular 0.1 to 1 mbar, may prevail during operation of processing an object. When using an electron beam or another charged particle beam the gas supply apparatus exhibits a hole for traversal of the partical beam, wherein the hole has a size that may correspond to a deflection range during scanning the surface using the particle beam.

The inventive processing system may not only be used for repairing masks for the lithography, but may also be used for repairing integrated circuits. Further, the inventive processing system may be used for manufacturing a (three-dimensional or layer-wise two-dimensional) stamp having (repetitive) structures, which stamp allows manufacturing of a plurality of microreaction vessels by imprinting into a substrate (Nano-Imprint).

Using the inventive processing system also so-called "Nanoimprint-masks" may be manufactured. This application is of interest in particular in the biotechnological and pharmaceutical development. Also Nano-Imprint-Lithography templates may be processed using the inventive system. Further, carbon nano tubes or silicone nano wires may be manufactured and/or processed using the system.

Using the inventive processing system also gold depositions at a substrate may be performed selectively binding thiol groups. For example, biomolecules, such as proteins, contain thiol groups over which they may be bound to a substrate provided with gold depositions.

Smallest metal structures manufactured using the inventive system are also suited for electron optical (Plasmonics) applications.

Figure 2:
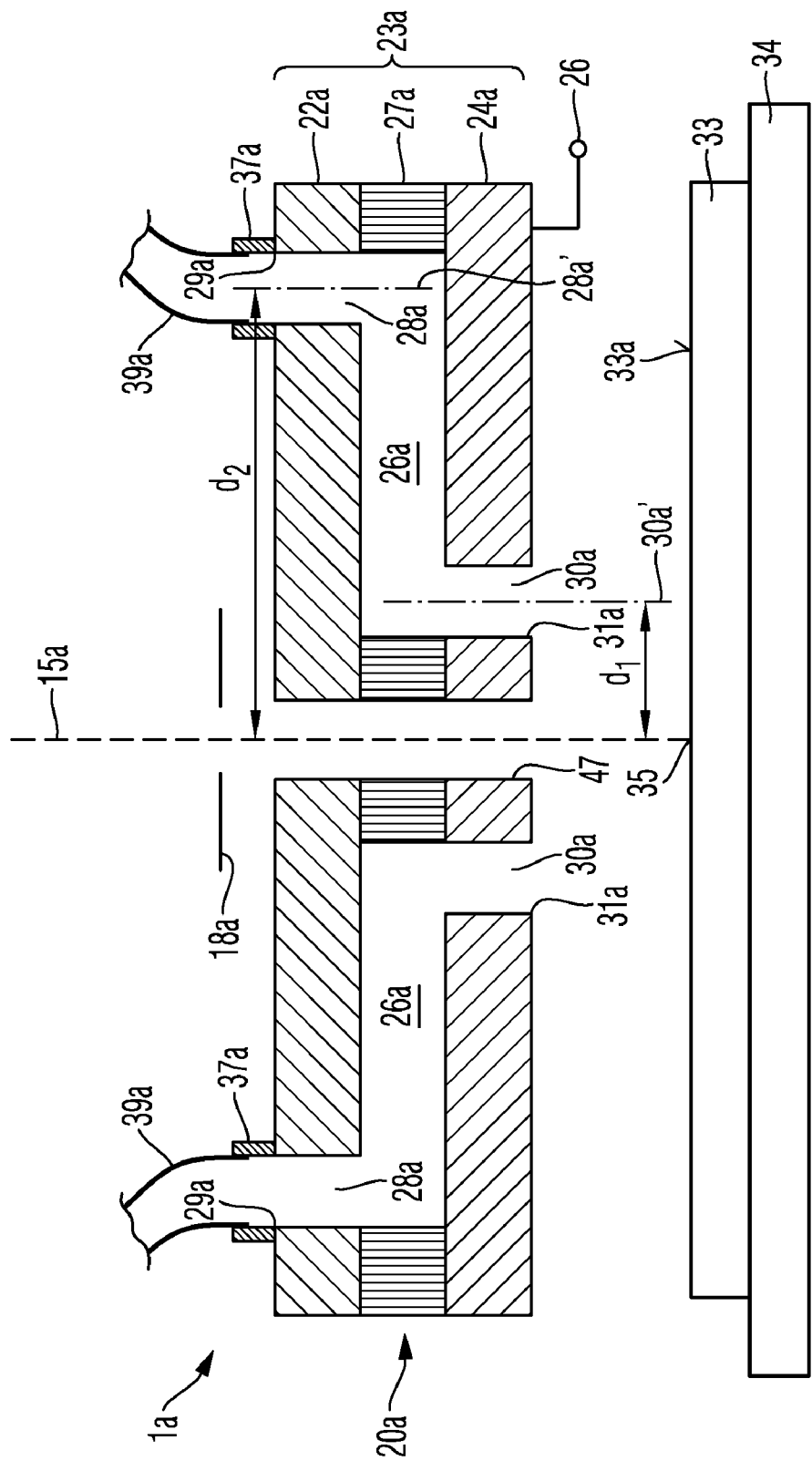
Figure 3A:
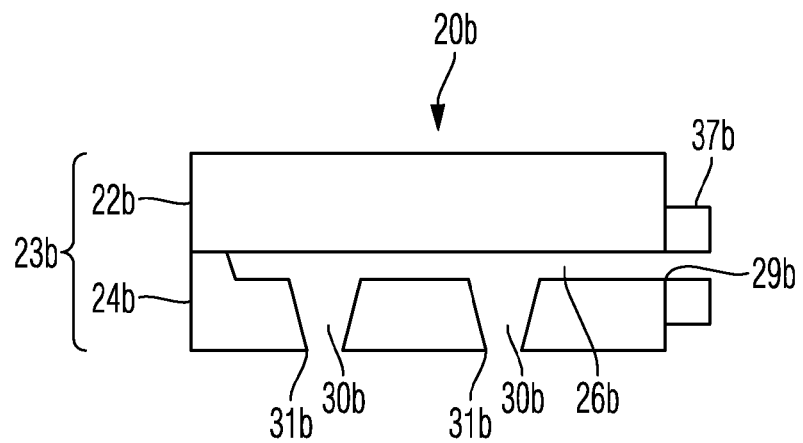
Figure 3B:
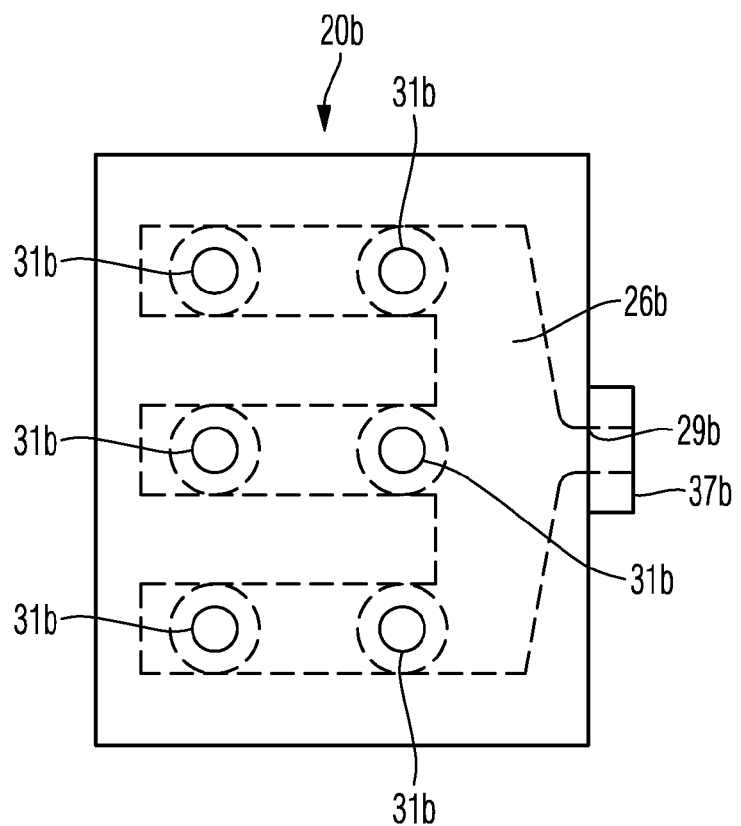
Figure 7A:
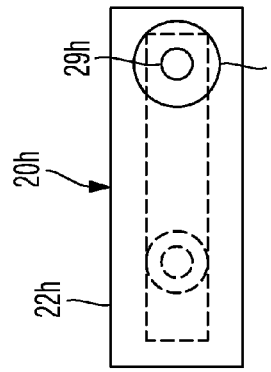
Figure 7B:
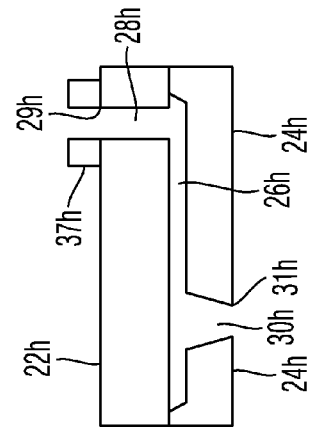
Figure 7C:
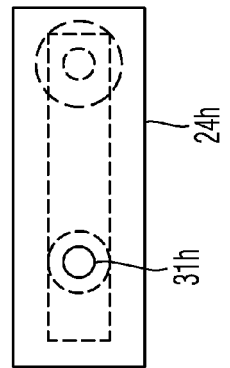
Figure 8A:
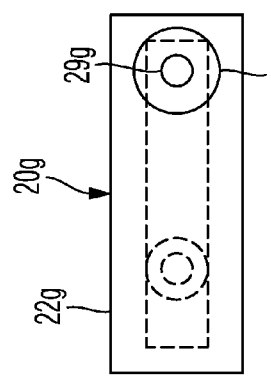
Figure 8B:
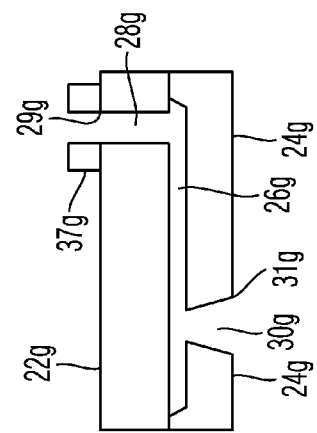
Figure 8C:
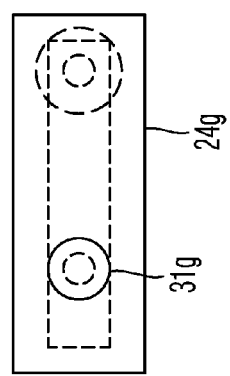
Figure 9A:
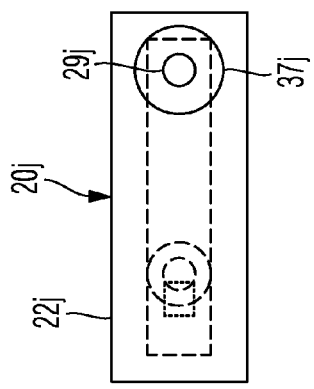
Figure 9B:
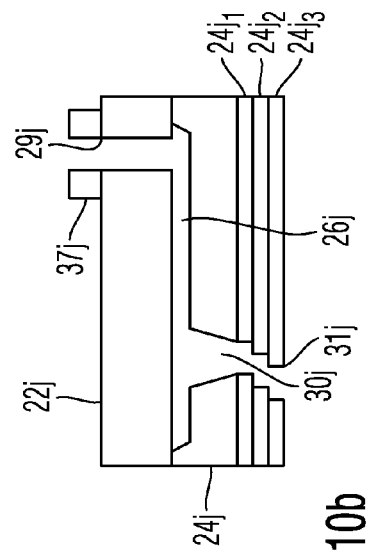
Figure 9C:
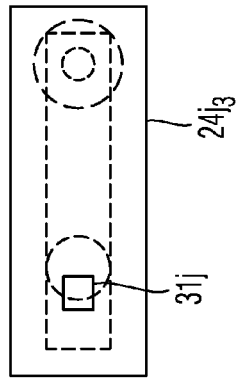
Figure 10A:
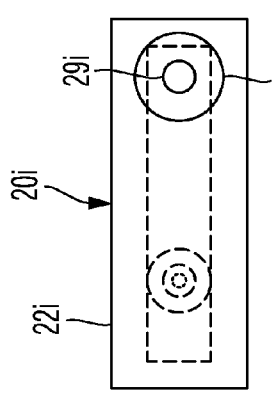
Figure 10B:
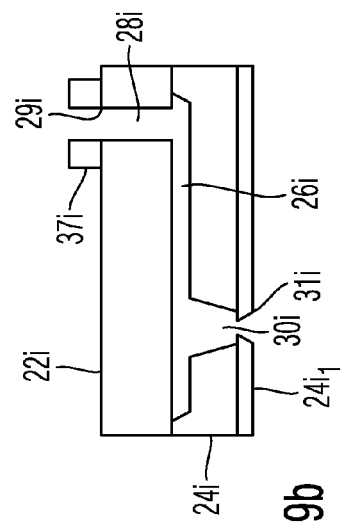
Figure 10C:
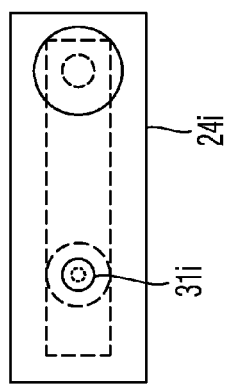
Figure 12A:
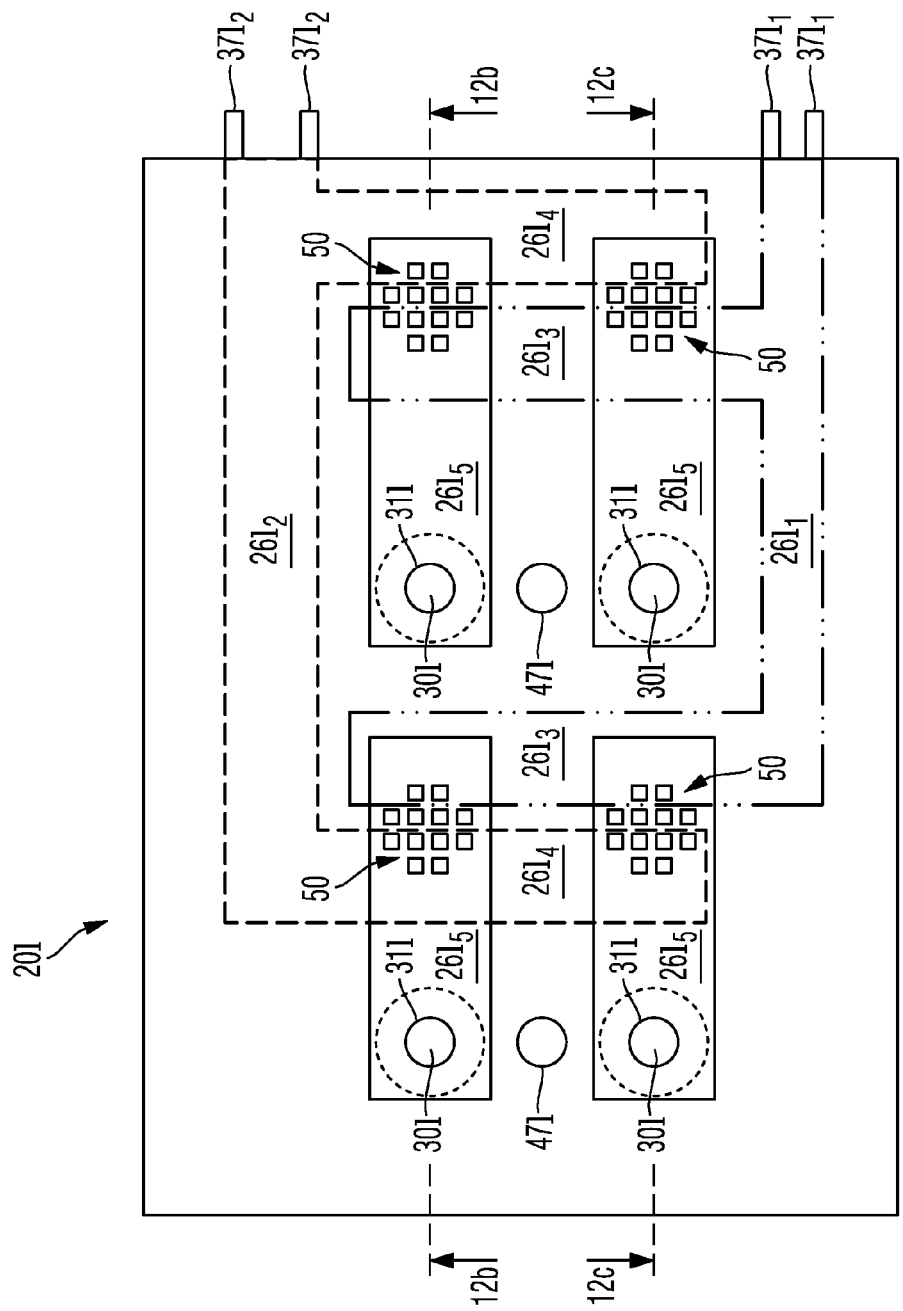
Figure 12B:
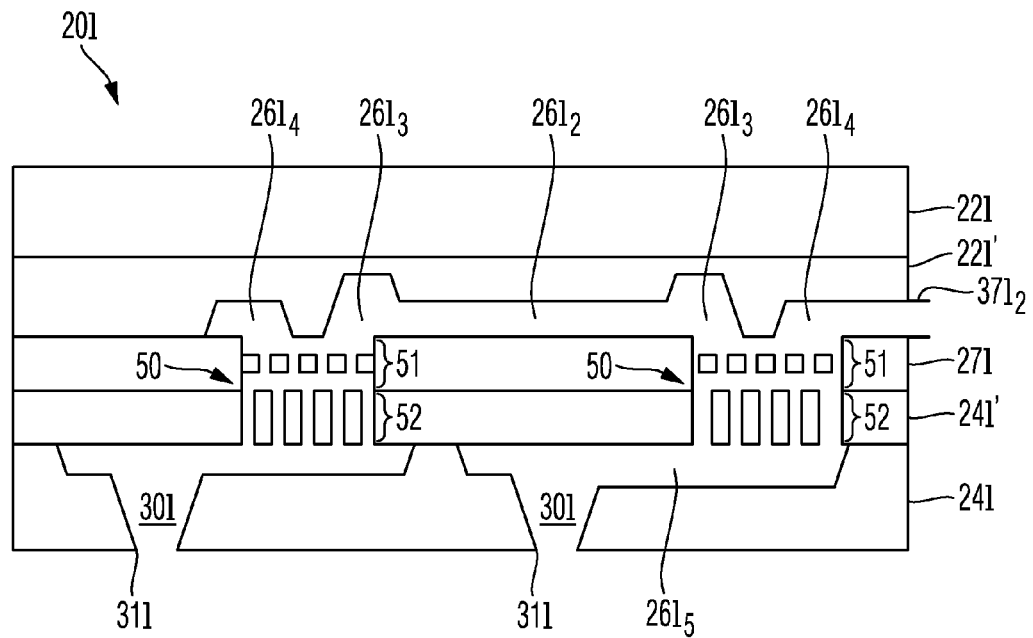
Figure 12C:
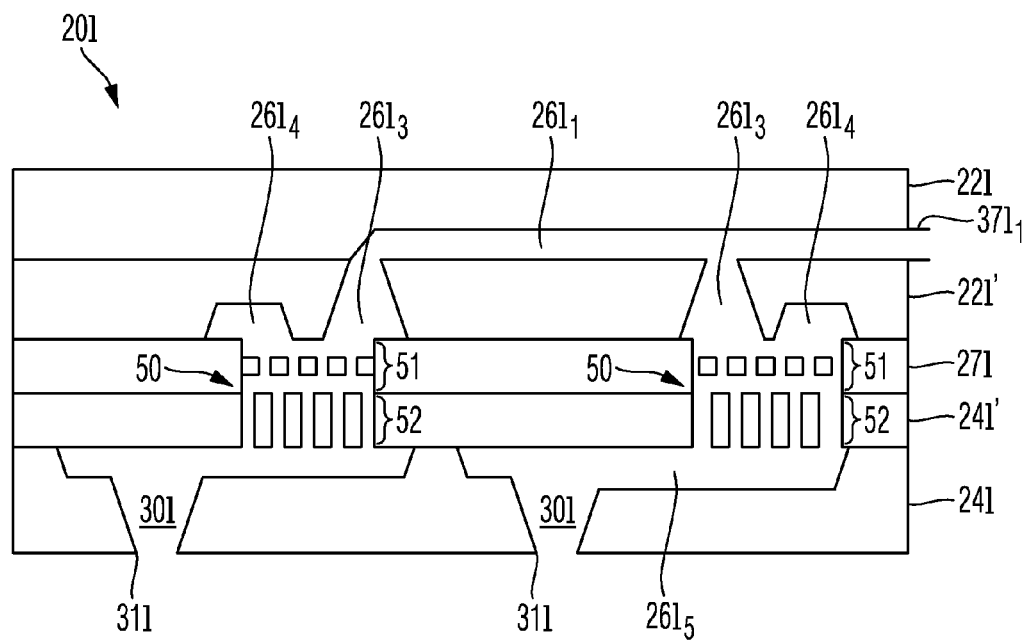
Figure 13A:
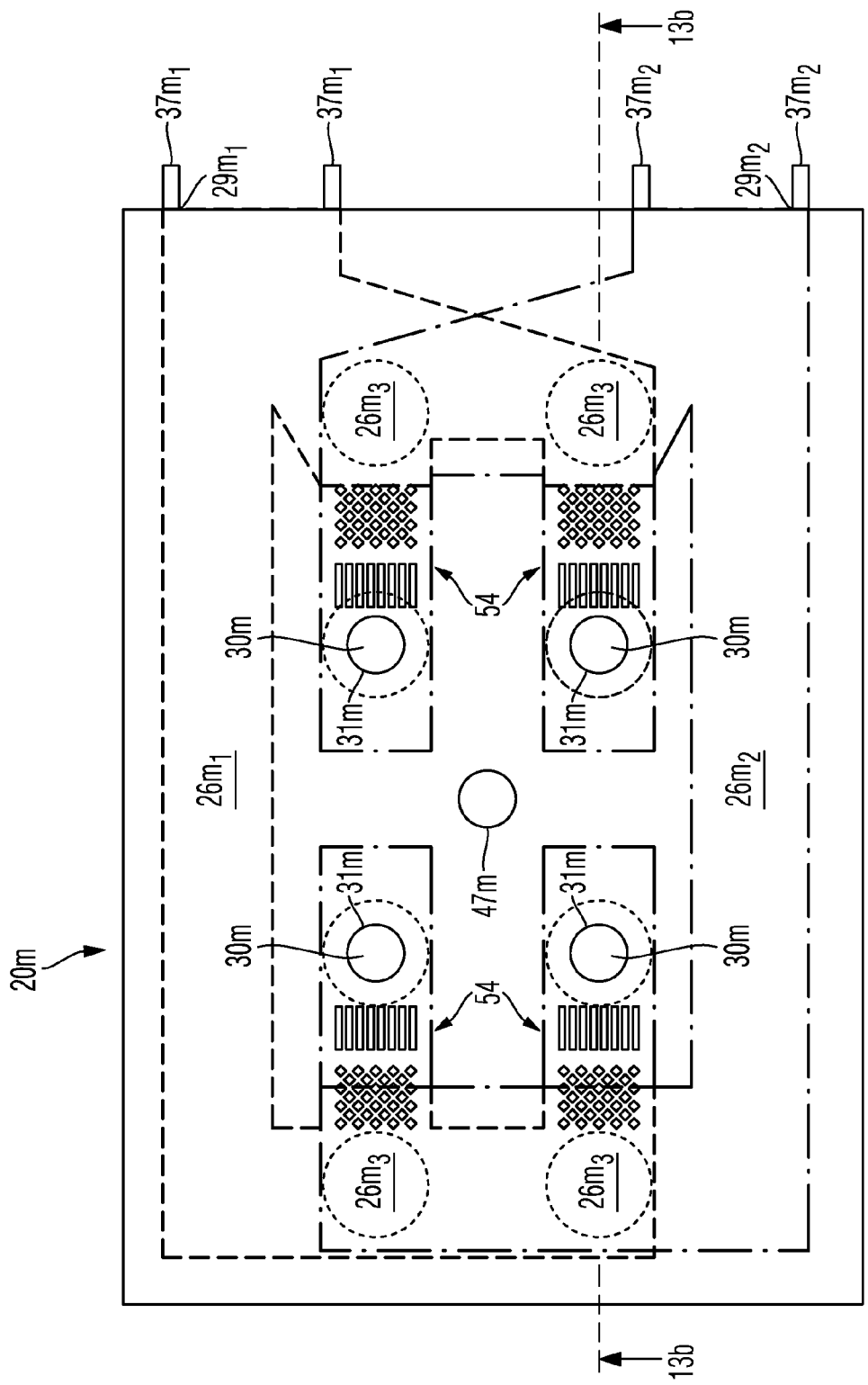
Figure 13B:
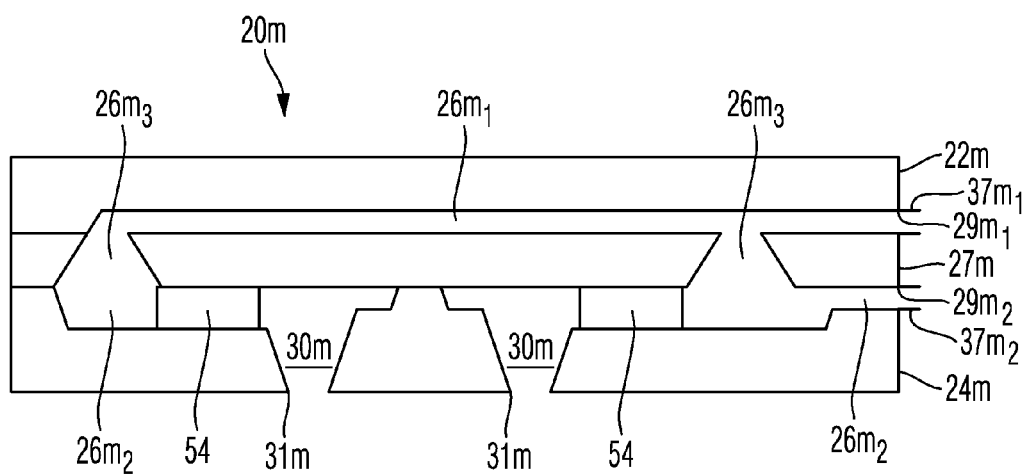
Figure 14A:
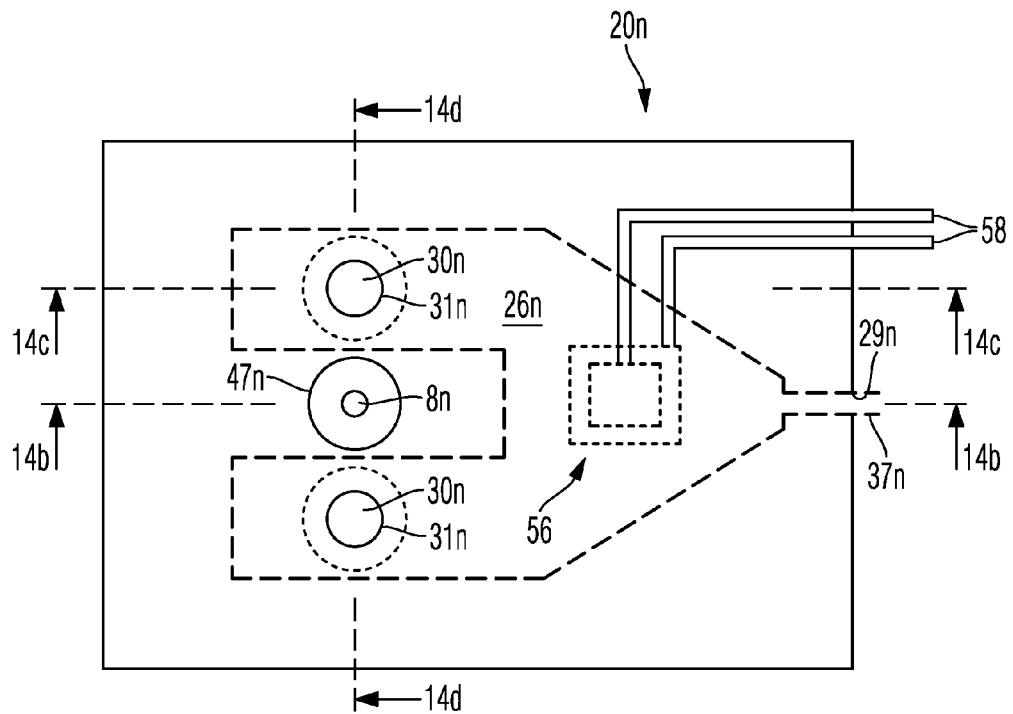
Figure 14B:
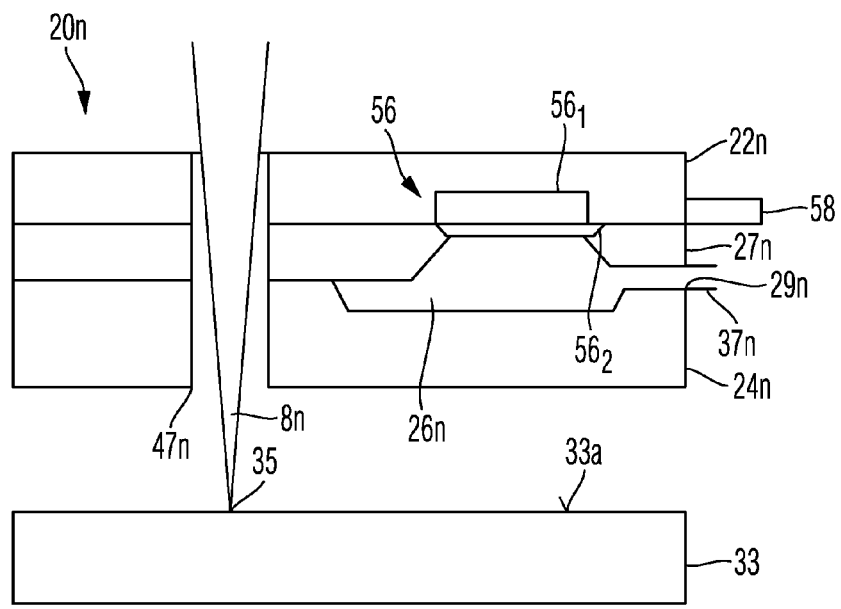
Figure 14C:
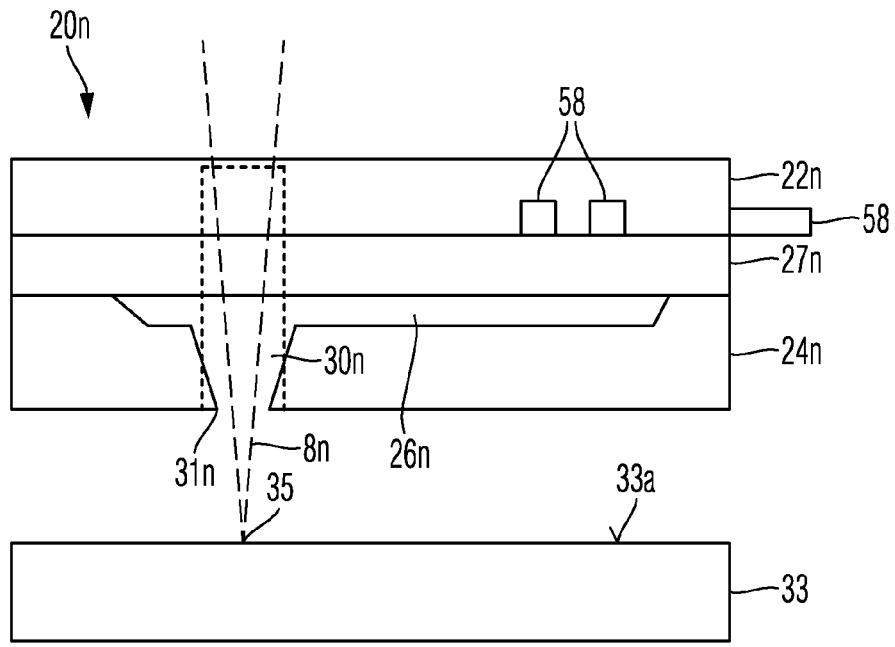

The inventive system will now be explained with reference to the accompanying drawings. Therein FIG. 1 shows a schematical illustration of a system for processing a surface of an object according to an embodiment of the present invention, FIG. 2 shows a partial schematic view of a processing system according to an embodiment of the present invention, FIGS. 3a and 3b show a geometry of a conduit system of a gas supply apparatus according to an embodiment of the present invention, FIGS. 4a to 4c show a nozzle geometry of a gas supply apparatus according to an embodiment of the present invention, FIGS. 5a to 5c show a nozzle geometry of a gas supply apparatus according to an embodiment of the present invention, FIGS. 6a to 6c show a nozzle geometry of a gas supply apparatus according to an embodiment of the present invention, FIGS. 7a to 7c show a nozzle geometry of a gas supply apparatus according to an embodiment of the present invention, FIGS. 8a to 8c show a nozzle geometry of a gas supply apparatus according to an embodiment of the present invention, FIGS. 9a to 9c show a nozzle geometry of a gas supply apparatus according to an embodiment of the present invention, FIGS. 10a to 10c show a nozzle geometry of a gas supply apparatus according to an embodiment of the present invention, FIGS. 11a to 11e show an embodiment of a gas supply apparatus according to the present invention, FIGS. 12a to 12c show an embodiment of a gas supply apparatus according to the present invention, FIGS. 13a and 13b show an embodiment of a gas supply apparatus according to the present invention, FIGS. 14a to 14c show an embodiment of a gas supply apparatus according to the present invention, FIGS. 15a to 15d show an embodiment of a gas supply apparatus according to the present invention, and FIGS. 16a and 16b show an embodiment of a gas supply apparatus according to the present invention.

FIG. 1 illustrates in a sectional view a system 1 for processing a surface of an object according to an embodiment of the present invention. The system 1 comprises a vacuum vessel 2 connected via an opening 19 to a not illustrated vacuum pump system. Within the vacuum vessel 2 an electron source 3 configured as cathode for generating an electron beam 8 along an axis 15 is arranged. Further, the system 1 comprises focussing/deflection elements 21 for focussing and deflecting the electron beam 8.

The electron beam 8 is surrounded by a beam tube 5 to which a high positive potential may be applied via an electrode terminal 7 and a voltage source, for example +8 kV. The potential applied the beam tube causes generating an electric field in the space between the electron source 3 and the beam tube 5 and within a part of the beam tube 5 that accelerates the electrons towards the surface 33a of the object 33. Thereby, the object 33 is hold at the object table 34. The electron beam travels along the axis 15 to impinge at the point 35 of the surface 33a of the object 33. For focussing the electron beam the focussing lens 11 is annularly arranged around the electron beam 8. The focussing lens 11 is a combination of a magnetic lens and an electrostatic immersion lens. Thereby, the magnetic lens comprises an inner pole piece 10 and an outer pole piece 9. By current flow in the coil 13 a magnetic flow through the pole pieces 9, 10 is generated by induction so that a magnetic field prevails in a region of an axial gap 16. This magnetic field causes focussing the electron beam 8.

By applying an appropriate voltage between the beam tube 5 and an electrode plate 18 it is possible to decelerate the primary electrons having eminated from the electron source 3 and initially having been accelerated by the electric field between electron source and beam tube to a primary energy of about 1 keV that is suitable to perform deposition of material or ablation of material at the point 35 of the surface 33a of the object 33 upon supplying a reaction gas. Instead of or additionally to applying a voltage between beam tube 5 and electrode plate 18 a voltage between the beam tube 5 and the gas supply apparatus 20 may be applied using the electrode terminal 36 which is connected to a voltage source. Thereby it is crucial, that during operation an electrical pulling field is built up between the surface 33a of the object 33 and the space around the axial gap 16 to allow electrons emanating from the surface 33a of the object 33 reaching the electron detector 17.

By scanning a surface portion of the surface 33a of the object 33 around the processing location 35 this inlens detector 17 thus allows the acquisition of an electron microscopic image from the surface portion around the processing location 35 to monitor a processing progress and thus to allow deciding about further processing.

The gas supply apparatus according to this embodiment of the inventive processing system comprises an upper plate 22 and a lower plate 24 that are connected in a plane 25 of maximal extension of the plates (this is a plane of a flat side of the plates) in a flush way to form a stack 23. The stack 23 extends in a plane substantially oriented perpendicular to the axis 15 of the electron beam 8. The stack 23 exhibits a through hole 47 in its center through which the electron beam 8 arrives from the electron source 3 along the axis 15 to the impingement point 35 at the surface 33a of the object 33.

Both plates 22 and 24 of this embodiment are manufactured of materials comprising metal, ceramics, polymers or/and semiconductor materials, in particular Si, $SiO_2$ or $Si_3N_4$. In FIG. 1 a section of a side view (face view), that mean a section perpendicular to the flat side of both plates through both plates is illustrated. The planes of maximal extensions thereby extend perpendicular to the drawing plane of FIG. 1.

The upper plate 22 exhibits at its underside in a region of the section plane illustrated in FIG. 1 a recess in which region also the lower plate 24 exhibits a recess at its upper side. Thus, in the stack 23 a first conduit section 26 (a longitudinal, pipe shaped cavity) is formed which is delimited by the upper plate 22 from above and the lower plate 24 from below. In the here illustrated embodiment the first conduit section has a pipe shape so that it is depicted in FIG. 1 as a rectangular region. A recess may also be provided in only one of the two plates, wherein a conduit system is formed in that the plate without recess closes the plate having the recess as a cover. Further, more than two plates may form the stack, wherein different conduit sections in different levels of the stack are formed that are connected by ducts between the levels or that lead to separate gas outlets.

The upper plate 22 of the stack 23 further exhibits a second conduit section 28 (gas inlet hole) having a gas inlet 29 communicating with the first conduit section 26 in a gas conducting way. Further, the upper plate 22 exhibits a gas terminal 37 to which a gas conduit 39 is connected leading to a substance reservoir 41. Thus, a substance contained in the substance reservoir may arrive as a gas via the gas conduit 39 and the second conduit section 28 into the cavity 26 inside the stack 23. For controlling the gas flow a valve 43 is arranged close to the gas terminal 37, wherein the valve is connected with a not illustrated valve controller for controlling the valve.

The lower plate 24 exhibits a third conduit section 30 (gas outlet hole) having a gas outlet 31. A distance of an axis 30' of the third conduit section 30 from the axis 15 amounts to $d_1$. A distance of an axis 28' of the second conduit section 28 of the upper plate 22 from the axis 15 amounts to $d_2$. It is apparent that the distance $d_2$ is greater than $d_1$. The third conduit section 30 allows via the gas outlet 31 supplying gas present in the first conduit section 26 to the surface 33a of the object 33. As illustrated in FIG. 1 the gas outlet 31 is located close to the processing location 35 of the surface 33a of the object 33. Thus, a substance present in the substance reservoir 41 may be lead as gas via the gas conduit 39, the second conduit section 28, the first conduit section 26, the third conduit section 30, and the gas outlet 31 to the processing location 35 in an advantageous way to deposite material or ablate material or to compensate charges at the surface of the object after activating it by the electron beam. By the gas supply apparatus 20 illustrated in FIG. 1 a widely homogeneous reaction gas concentration may be provided at the surface of the object enabling effective processing. FIG. 2 shows a partial sectional view of a further embodiment 1a of a processing system according to the present invention, wherein a number of components illustrated in FIG. 1 are not again illustrated in FIG. 2. Their construction and their function may be taken from FIG. 1 as well as from the corresponding description. Components analogous to those of the embodiment shown in FIG. 1 are denoted with the same reference number, wherein the letter "a" is added.

The processing system 1a comprises a gas supply apparatus 20a. The gas supply apparatus 20a comprises a stack 23a, formed by three stacked plates 22a, 27a, and 24a arranged above each other. With their respective flat sides the upper plate 22a and the middle plate 27a are connected and the middle plate 27a and the lower plate 24a are connected. The stack 23a and thus the plates 22a, 27a, and 24a extend in a plane perpendicular to the axis 15, respectively. As FIG. 1 also FIG. 2 shows a section through the stack 23a, wherein the section is oriented perpendicular to the flat sides (planes of maximal extensions) of the plates 22a, 27a, and 24a.

The stack 23a exhibits inside first conduit sections 26a symmetrically to both sides of the axis 15. The first conduit sections 26a are thereby delimited by the upper plate 22a from above and the lower plate 24a from below across their entire length, respectively. In the section plane shown in FIG. 2 the middle plate 27a exhibits in this region an open area extending through the full thickness of the middle plate 27a. Thus, the first conduit sections 26a are formed by closing this open area with the upper plate 22a from above and the lower plate 24a from below. As the gas supply apparatus 20 illustrated in FIG. 1 also the gas supply apparatus 20a comprises a second conduit section 28a (gas inlet hole) having a gas inlet 29a that is connected via a gas terminal 37a and a gas conduit 39a to a reservoir in a gas conducting manner. Thereby, reaction gas may be introduced into the first conduit sections 26a.

For supplying the reaction gas to the surface 33a of the object 33 the gas supply apparatus 20a further comprises a third conduit section 30a (gas outlet hole) having a gas outlet 31a. Again a distance $d_1$ between an axis 30a' of this third conduit section 30a and the axis 15a is smaller than a distance $d_2$ between an axis 28a' of the second conduit section 28a and the axis 15. Thus, reaction gas may be lead from a location far away from the axis 15a to the processing location 35 of the object 33. Thus, processing the object by locally activating a reaction gas at the processing location 35 is possible.

FIGS. 3a and 3b show a further embodiment 20b of a gas supply apparatus according to the present invention, wherein in FIG. 3a a cross section perpendicular to a flat side of the gas supply apparatus 20b (as in FIGS. 1 and 2) is illustrated and in FIG. 3b a view from below of the gas supply apparatus 20b along the axis 15 is illustrated. The gas supply apparatus 20b illustrated in FIGS. 3a and 3b comprises an upper plate 22b and a lower plate 24b as well as a terminal 37b which is arranged at a face side of the stack. Via this terminal gas may be supplied to a first conduit section 26b provided inside the stack 23b formed by the upper plate 22b and the lower plate 24b. Via six gas outlets 31b located at six third conduit sections 30b gas may be supplied to a surface of an object (not illustrated) located below the lower plate 24b. FIG. 3b illustrates in a plan view the shape of the first conduit section 26b as broken line. Thus, this first conduit section 26b is designed such that the one gas terminal 37b is connected to the six third conduit sections 30b.

FIGS. 4a to 4c, 5a to 5c, 6a to 6c, 7a to 7c, 8a to 8c, 9a to 9c, and 10a to 10c show different geometries of third conduit sections 30d, . . . , 30j of gas supply apparatuses 20d, . . . , 20j according to embodiments of the present invention. FIGS. 4a, 5a, 6a, 7a, 8a, 9a, and 10a schematically show a plan view along the axis 15 of the upper plate 22d, . . . , 22j, respectively, and FIGS. 4c, 5c, 6c, 7c, 8c, 9c, and 10c schematically show a plan view onto the lower plate 24d, . . . , 24j respectively. In FIGS. 4b, 5b, 6b, 7b, 8b, 9b, and 10b a cross section perpendicular to a plane of a flat side of the plates of the gas supply apparatus is illustrated, respectively, in a view analogous to the views of the FIGS. 1, 2 and 3. FIGS. 4b and 5b thereby show sections of the FIGS. 4a and 5a, along the section lines indicated by arrows 4b and 5b, respectively, all other sections are obtained along a straight respective middle line. All embodiments of the gas supply apparatus illustrated in FIGS. 4a to 10c comprise an upper plate 22d, . . . , 22j, respectively, and a low plate 24d, . . . , 24j, respectively. The embodiments illustrated in FIGS. 9a to 9c and 10a to 10c further comprise plates following the lower plate 24i and 24j, respectively, to allow fine structuring the third conduit section 30i and 30j, respectively.

In the FIGS. 4a, 5a, 6a, 7a, 8a, 9a, and 10a respective cross sections of second conduit sections 28d, . . . , 28j are shown, respectively. In the embodiments illustrated here they have a circular shape. Depending on requirements also other cross sectional shapes may be chosen. In the FIGS. 4b, 5b, 6b, 7b, 8b, 9b, and 10b longitudinal sections of the third conduit sections 30d, . . . , 30j are shown, respectively. A longitudinal cross section of such a third conduit section 30d, . . . , 30j thereby may assume a regular shape, such as a rectangular, a triangle, a trapezoid, a semi-circle, or may assume an irregular shape. In the FIGS. 4c, 5c, 6c, 7c, 8c, 9c, and 10c cross sections of third conduit sections 30d, . . . , 30j are shown, respectively. They may assume a regular shape, such as a rectangle, a circle, an elypse, or may assume an irregular shape. By an appropriate choise of a shape of the cross section and/or longitudinal section of a third conduit section a desired gas supply characteristics to the surface of the object may be achieved.

Figure 11A:
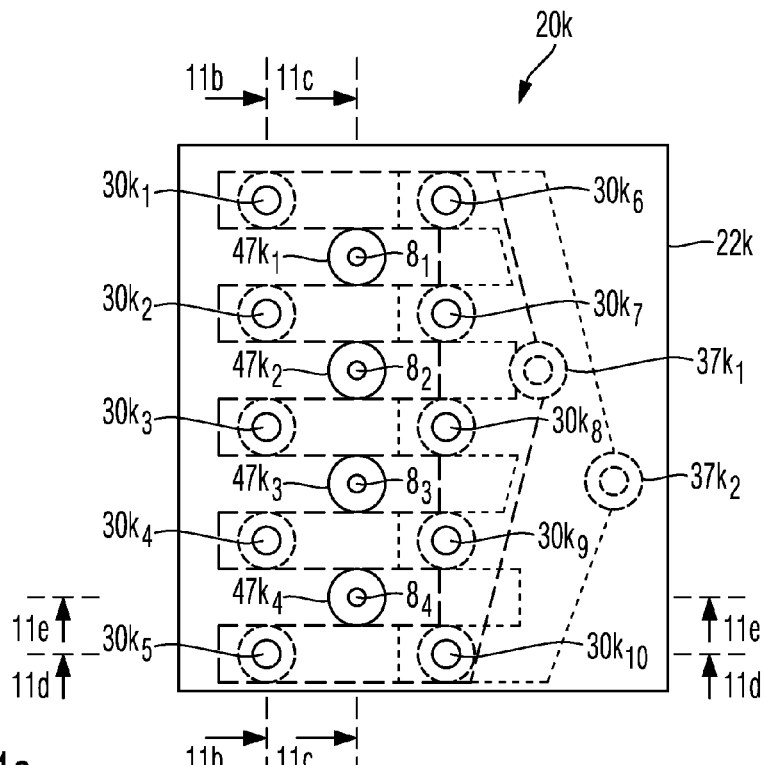
Figure 11B:
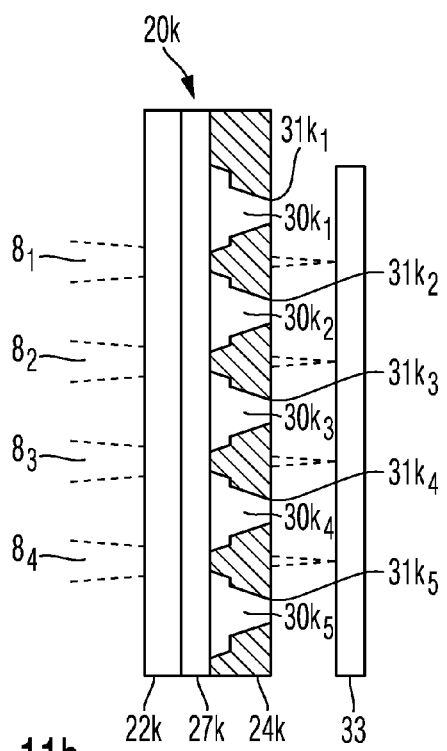
Figure 11C:
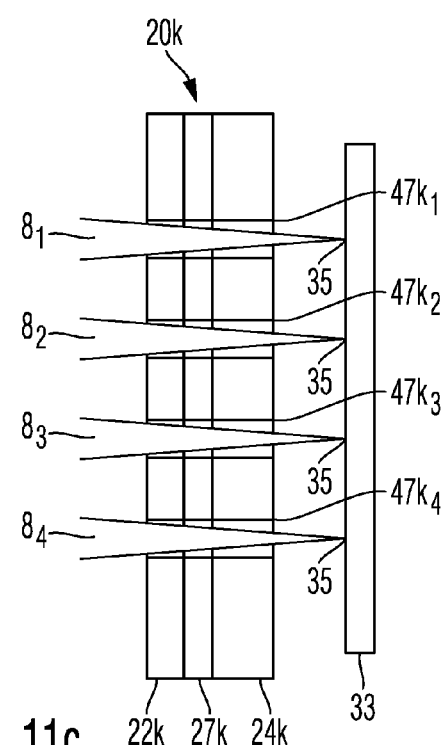
Figure 11D:
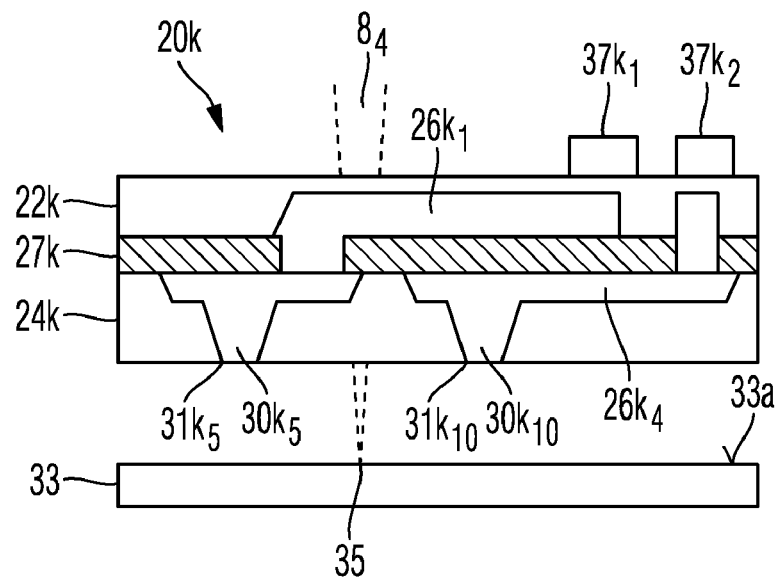
Figure 11E:
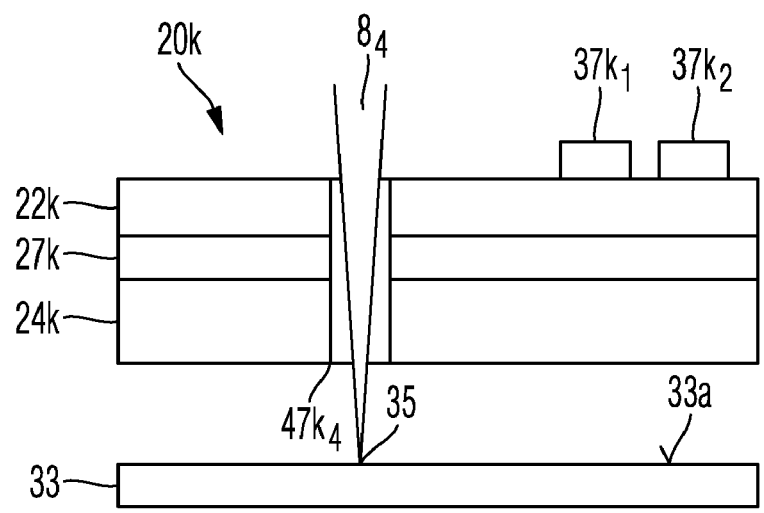

FIG. 11a to 11e show a further embodiment 20k of a gas supply apparatus according to the present invention in different views and in different sectional views, respectively. Thereby, FIG. 11a shows a plane view of the gas supply apparatus 20k as viewed along the axis 15, that means a plane view of the flat sides of the plates $20k$, $27k$, and $24k$ forming the gas supply apparatus $20k$. FIGS. 11$b$ and 11$c$ illustrate in a side view vertical sections obtained by cutting the gas supply apparatus $20k$ along dashed lines indicated by arrows 11$b$ and 11$c$ in FIG. 11$a$ respectively, and viewing in corresponding arrow direction. FIGS. 11$d$ and 11$e$ illustrate in a side view vertical sections obtained by cutting the gas supply apparatus $20k$ along dashed lines indicated by arrows 11$d$ and 11$e$ in FIG. 11$a$, respectively, and viewing in corresponding arrow direction.

In this embodiment the gas supply apparatus $20k$ comprises four through holes $47k_1$, $47k_2$, $47k_3$, and $47k_4$ enabling four electron beams $8_1$, $8_2$, $8_3$, and $8_4$ to impinge through the gas supply apparatus $20k$ onto the surface $33a$ of the object $33$. The gas supply apparatus $20k$ further comprises a plurality of third conduit sections $30k_1, \ldots, 30k_{10}$ (gas outlet holes). Four third conduit sections $30k$ are thereby arranged around each through hole $37k_1, \ldots, 37k_4$ to supply reaction gas to the four processing locations being processed using the four electron beams $8_1, \ldots, 8_4$.

In contrast to the previously illustrated embodiments the gas supply apparatus $20k$ illustrated in FIGS. 11$a$ to 11$e$ comprises three plates $22k$, $27k$, and $24k$ wherein a first conduit section $26k_1$ is delimited by the upper plate $22k$ and the middle plate $27k$, and wherein a fourth conduit section $26k_4$ is delimited by the middle plate $27k$ and the lower plate $24k$ (see FIG. 11$d$). Thus, conduit sections $26k_1$ and $26k_4$ result being arranged in two different levels of the stack $23k$. These two conduit sections $26k_1$ and $26k_4$ are connected to a gas terminal $37k_1$ and $37k_2$, respectively, in a gas conducting manner, wherein the gas terminals are arranged at an upper flat side of the upper plate $22k$. The conduit section $26k_1$ is connected to the third conduit sections $30k_1, \ldots, 30k_5$, and the conduit section $30k_4$ is connected to the third conduit sections $30k_6, \ldots, 30k_{10}$. Thus, using the embodiment $20k$ of a gas supply apparatus illustrated in FIGS. 11$a$ to 11$e$ a to be processed surface of an object may simultaneously be processed at plural locations, wherein two different gases may simultaneously be supplied. Using such a complex gas conduit system of the inventive gas supply apparatus two different gases may be supplied close to a processing point $35$ of the surface $33a$ of the object $33$ allowing a variante rich processing method.

FIGS. 12$a$, 12$b$, and 12$c$ show an embodiment $20l$ of a gas supply apparatus according to the present invention. FIG. 12$a$ shows a view of a flat side of the gas supply apparatus $20l$, that means a plan view of the same. In the FIGS. 12$b$ and 12$c$ sectional views of the gas supply apparatus $20l$ are illustrated obtained by cutting at the lines indicated by the arrows 12$b$ and 12$c$ in FIG. 12$a$, respectively, and viewing in direction of the arrows. The gas supply apparatus $20l$ comprises a most upper plate $22l$, a second most upper plate $22l'$, a middle plate $27l$, a second most lower plate $24l'$ and a most lower plate $24l$ adjoining with their flat sides, respectively. At a face side of the stack of the gas supply apparatus $20l$ formed by the plates $22l$, $22l'$, $27l$, $24l'$, and $24l$ a gas terminal $37l_1$ is arranged between the most upper plate $22l$ and the second most upper plate $22l'$, to supply a first gas. The first gas arrives at a conduit section $26l_1$ extending parallel to the flat side of the stack and from there in a conduit section $26l_3$ running substantially perpendicular to the flat side of the stack to reach a mixer $50$. At the face side of the stack where the first gas terminal $37l_1$ is located between the second most upper plate $22l'$ and the middle plate $27l$ of the stack of the gas supply apparatus $20l$ a second gas terminal $37l_2$ is arranged to supply a second gas. Via a conduit section $26l_4$ running substantially parallel to the flat side of the stack the second gas arrives at the mixer $50$. The mixer is a passive element for mixing the first gas and the second gas and is constructed by mixing aiding elements $51$ and $52$ causing swirling and mixing the gases flowing therethrough. The elements $51$ and $52$ are for example formed by a sieve or a grill. A gas mixture obtained by mixing the first gas and the second gas arrives at a conduit section $26l_5$ formed between the most lower plate $24l$ and the second most lower plate $24l'$. From there the gas mixture arrives at conduit sections $30l$ to exit via outlets $31l$ from the gas supply apparatus to be supplied to an object arranged below the stack illustrated in FIGS. 12$b$ and 12$c$. Thus, the embodiment $20l$ of a gas supply apparatus according to the present invention illustrated in the FIGS. 12$a$, 12$b$, and 12$c$ allows to mix two gases within the same before the mixture is supplied to a surface of the object. In FIG. 12$a$ further a throughhole $471$ is arranged between two gas outlets $31l$, respectively, to allow traversal of an electron beam for activating the gas mixture at the surface of the object. It is noted that the mixer $50$ of the gas supply apparatus $20l$ mixes both gases in a conduit section of the gas supply apparatus inside the stack which is arranged substantially perpendicular to the flat side of the stack. Such a mixer is also denoted as a vertical mixer.

FIGS. 13$a$ and 13$b$ show an embodiment $20m$ of a gas supply apparatus according to the present invention. FIG. 13$a$ shows a view of a flat side of the gas supply apparatus $20m$ and FIG. 13$b$ shows a sectional view obtained by cutting the gas supply apparatus $20m$ along a line indicated in FIG. 13$a$ using arrows 13$b$ and viewing in the direction of the arrows. The gas supply apparatus $20m$ comprises an upper plate $20m$, a middle plate $27m$ and a lower plate $24m$. Between the upper plate $27m$ and the middle plate $27m$ a first gas terminal $37m_1$ for supplying a first gas is arranged at a face side of the stack formed by the plates $22m$, $27m$, and $24m$. The supplied first gas arrives via conduit section $26m_1$ lying substantially parallel to a flat side of the stack and a conduit section $26m_3$ lying substantially perpendicular to a flat side of the stack to a horizontal mixer $54$. At the same face side of the stack formed by the plates $22m$, $27m$, and $24m$ of the gas supply apparatus $20m$ between the middle plate $27m$ and the lower plate $24m$ a gas terminal $37m_2$ is arranged to supply a second gas. The second gas arrives via a conduit section $26m_2$ lying substantially parallel to the flat side of the stack at the horizontal mixer $54$. The horizontal mixer $54$ may comprise a sieve, a grill and/or other mixing aiding elements to mix the first gas and the second gas with each other. Via a conduit section $30m$ the gas mixture exits the gas supply apparatus via a gas outlet $31m$ to be supplied to a surface of an object being arranged below the stack in FIG. 13$b$. As is illustrated in FIG. 13$a$ the gas supply apparatus $20m$ further comprises a throughhole $47m$ to allow traveral of an electron beam through the gas supply apparatus $20m$ onto the surface of the object to activate the gas mixture. Using the embodiment $20m$ of a gas supply apparatus illustrated in FIGS. 13$a$ and 13$b$ thus enables to mix two different gases within the gas supply apparatus inside a conduit section lying parallel to the stack using a horizontal mixer and to supply the gas mixture to the surface of the to be processed object.

The mixers $50$ and $54$ illustrated in FIGS. 12$a$, 12$b$, 12$c$, and 13$a$ and 13$b$ may also comprise active elements, such as micromotors for mixing the two gases.

FIGS. 14$a$, 14$b$, and 14$c$ illustrate an embodiment $20n$ of a gas supply apparatus according to the present invention. FIG. 14$a$ shows a view of a flat side of the gas supply apparatus $20n$ that means a plane view of the same. FIGS. 14$b$ and 14$c$ show sectional views obtained by cutting at the lines indicated by arrows 14$b$ and 14$c$ and viewing in direction of these arrows. The gas supply apparatus $20n$ comprises a stack of plates formed by an upper plate 22n, a middle plate 27n and a lower plate 24n, wherein these plates adjoin each other with their flat side. By a gas terminal 37n arranged at a face side of the stack of the plates of the gas supply apparatus 20n gas may be supplied to the gas supply apparatus 20n to arrive in a conduit section 26n. The conduit section 26n essentially extends parallel to the flat side of the plates 22n, 27n, and 24n forming the stack. At an abuting face towards the middle plate 27n a sensor 56 is arranged in the upper plate 22n from which sensor electrical terminals 58 are lead out of the gas supply apparatus. Via the electrical terminals 58 a measuring signal of the sensor 56 may be lead to an external controller. The sensor may be a micromechanical pressure sensor arranged between the upper plate 22n and the middle plate 27n. For example an electrode 56, of the sensor may be arranged in the upper plate 22n and a further electrode $56_2$ of the sensor, such as a sensor electrode of a pressure sensor, may form an abutment of a conduit section 26n in which a reaction gas is present. Using the pressure sensor 56 the pressure of the reaction gas present in the conduit section 26n may be measured. Instead of or additional to a pressure sensor further a gas flow sensor may be arranged inside the gas supply apparatus 26n to measure a gas flow. The determined gas pressure or gas flow may advantageously be utilised for optimisation of processing the object. The gas may be supplied to the surface of an to be processed object via the conduit section 30n and the outlet 31n.

Figure 15A:
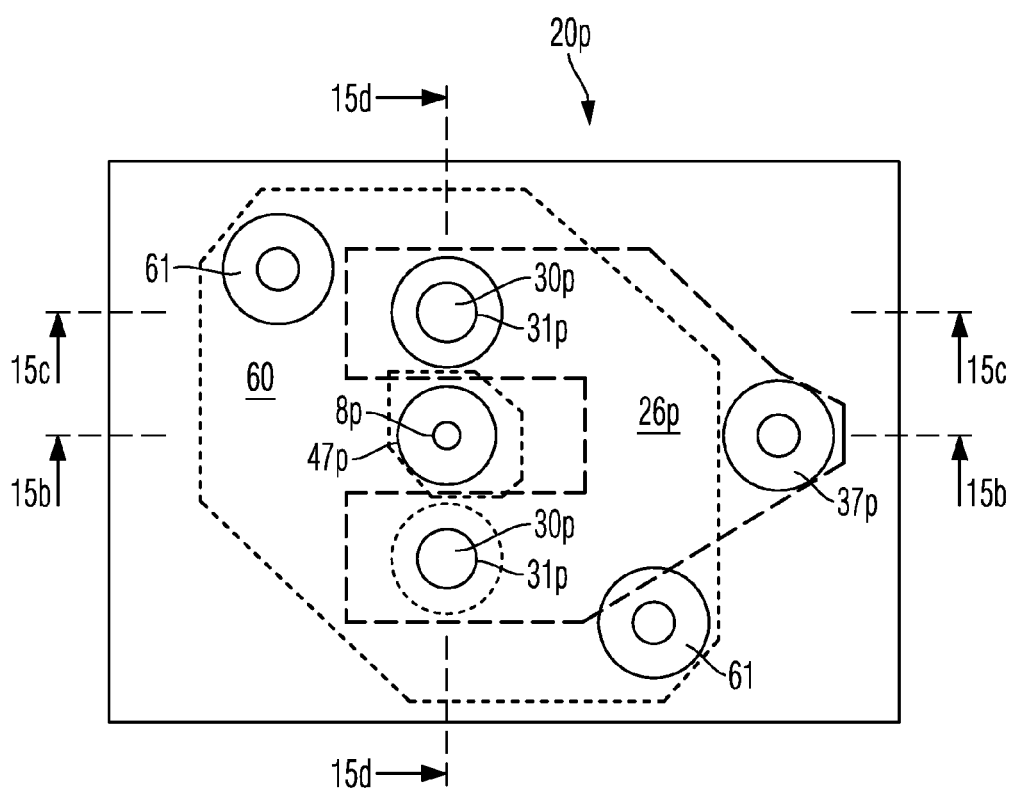
Figure 15B:
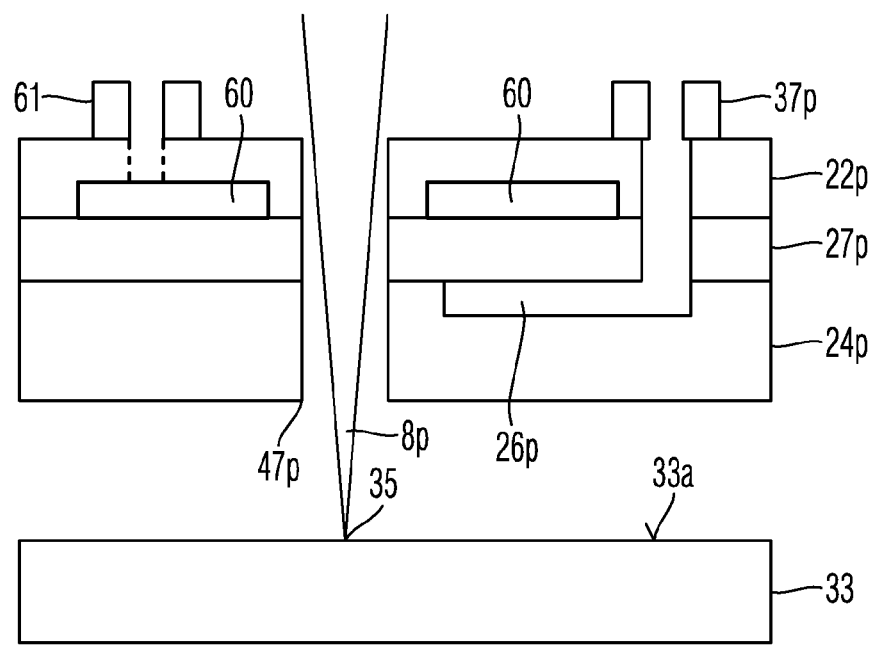
Figure 15C:
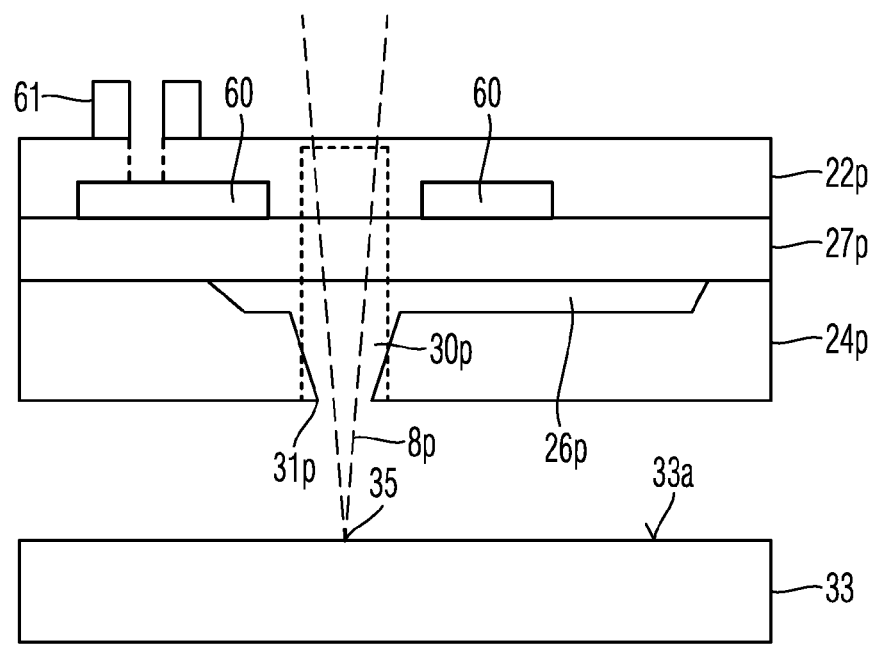
Figure 15D:
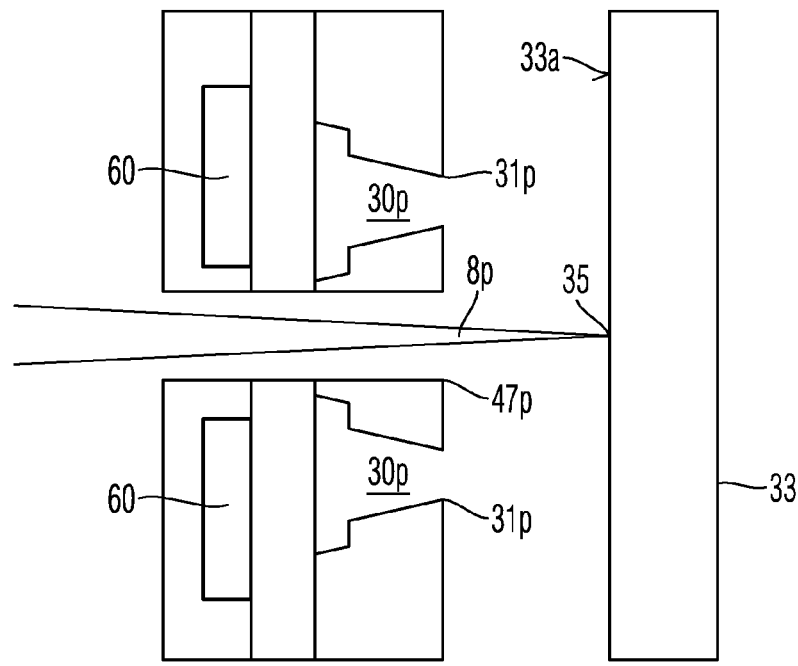
Figure 16A:
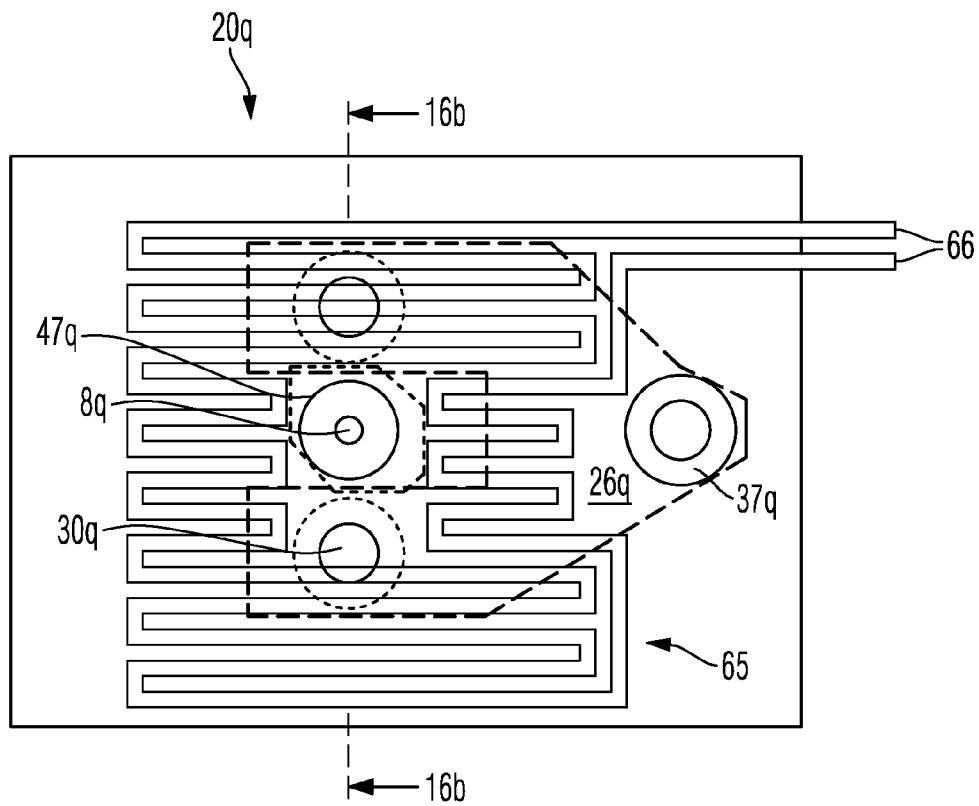
Figure 16B:
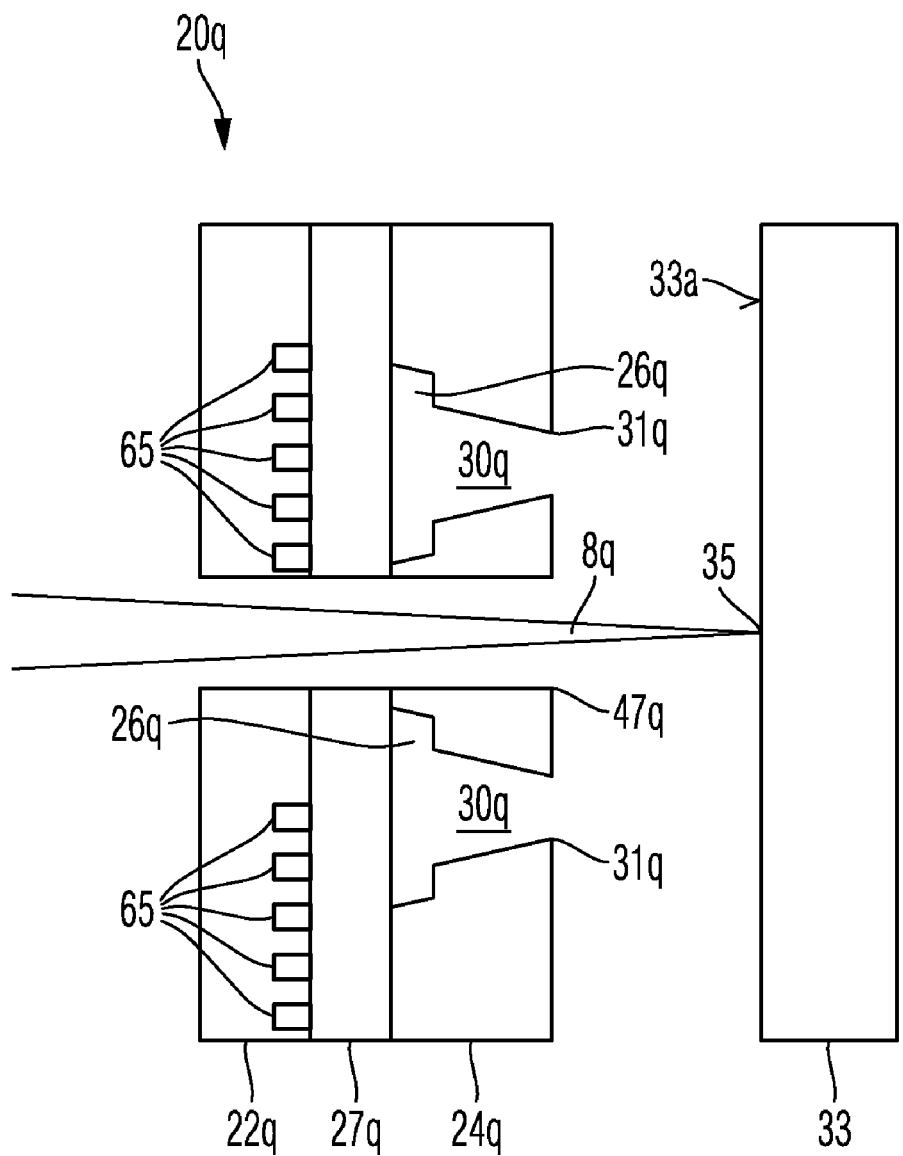

FIGS. 15a, 15b, 15c, and 15d show an embodiment 20p of a gas supply apparatus according to the present invention. Again in FIG. 15a a plan view of the gas supply apparatus is shown and in the FIGS. 15b, 15c, and 15d sectional views with respect to the lines indicated by the arrows 15b, 15c, and 15d. Many elements of the gas supply apparatus 20p are similar to those of previously described gas supply apparatuses so that their detailed description is avoided. In contrast to the previously described embodiments of a gas supply apparatus the gas supply apparatus 20p comprises a spatial area 60 (region of a fluid) arranged between the upper plate 22p and the middle plate 27p around a throughhole 47p for accommodating a cooling liquid. This spatial area 60 is indicated in FIG. 15a in a plan view by finely dashed lines whereas a conduit section 26p for accommodating a reaction gas is indicated by boldly dashed lines. Via cooling means terminals 61 cooling means may be filled into the spatial area 60. Via the middle plate 27p or a portion therefrom the spatial area 60 filled with cooling means is in thermal contact with a conduit section 26p which may be filled with gas via a gas terminal 37p. Thus, gas supplied to the gas supply apparatus may be cooled before it flows out of the gas supply apparatus 20p via the conduit section 30p and the gas outlet 31p. Thus, using the gas supply apparatus 20p gas may advantageously be cooled before supplying it to the processing location 35 of the object 33 for activating it by the electron beam 8p.

FIGS. 16a and 16b illustrate an embodiment 20q of a gas supply apparatus according to the present invention. Again in FIG. 16a a plan view of the gas supply apparatus is shown and in the FIG. 16b a sectional view of the gas supply apparatus 20q is shown defined by the arrow 16b indicated in FIG. 16a. The gas supply apparatus 20q comprises an upper plate 22q, a middle plate 27q and a lower plate 24q adjoining each other with respective flat sides. The gas supply apparatus 20q comprises a gas terminal 37q via which gas may be supplied to a conduit section 26q of the gas supply apparatus 20q. In contrast to the previously described gas supply apparatuses the gas supply apparatus 20q comprises a heater 65 embedded into the upper plate 22q, to immediately contact the middle plate 27q abutting the upper plate 22q. The heater 65 is in the illustrated embodiment formed as a heating coil which may be supplied via terminal 66 with electrical energy for heating, wherein the electrical energy may be supplied from an external controller. The heater 65 is in thermal contact with the middle plate 27q and thus with the conduit section 26q which may accommodate reaction gas. By heat transfer from the heater 65 to the reaction gas present in the conduit section 26q the reaction gas may be preactivated before leaving via the conduit section 30q and the outlet 31q from the gas supply apparatus 20q to arrive close to the processing location 35 of the object 33. There it may be activated by the electron beam traversing the throughhole 47q to enable processing the processing location 35. Thus, the gas supply apparatus 20q enables preactivating the reaction gas by supply of thermal energy inside the gas supply apparatus formed by the plates immediately before supplying the reaction gas to the surface of the to be processed object.

The mixer, the pressure sensor, the spatial area of a fluid and the heater shown in FIGS. 12 to 16 may also be comprised in other embodiments of a gas supply apparatus described in this application, separately or in combination.

The invention claimed is:

1. A system for processing an object, the system comprising:
   a gas supply apparatus for supplying gas to the object;
   a beam source for generating at least one activation beam for activating the gas; and
   a beam optics for directing the at least one activation beam to the object,
   wherein the gas supply apparatus comprises a stack of a plurality of plates, being adjoined via their flat sides extending transverse to a beam direction of the activation beam, wherein the stack of plates allows traversal of the activation beam towards the object and wherein the stack of plates comprises at least one gas inlet and at least one gas outlet which gas outlet is arranged in a flat side of a plate of the stack which plate is arranged closest to the object, wherein the gas inlet and the gas outlet are connected with each other by a conduit system formed in the stack which conduit system comprises at least one conduit section extending from a location in the stack remote from a location of the traversal of the activation beam to a location close to the location of the traversal of the activation beam, wherein the gas supply apparatus further comprises a tempering apparatus inside the stack of plates for at least one of cooling and heating gas contained in the gas conduit system.

2. The system according to claim 1, wherein a ratio of a length of the conduit section and a thickness of the stack is greater than 4, in particular greater than 10.

3. The system according to claim 1, wherein the stack comprises a first plate and a second plate both delimiting the conduit section over its entire length.

4. The system according to claim 1, wherein the gas inlet is arranged in a flat side of a plate of the stack arranged farthest from the object.

5. The system according to claim 1, wherein the gas inlet is arranged in a face side of the stack.

6. The system according to claim 1, wherein the gas supply apparatus comprises a plurality of gas inlets to supply several different gases to the object.

7. The system according to claim 6, wherein the gas supply apparatus comprises a plurality of gas outlets to separately supply the several different gases to the object.

8. The system according to claim 1, wherein the gas supply apparatus comprises a plurality of gas outlets being connected by the gas conduit system to a common gas inlet.

9. The system according to claim 1, wherein the beam source is adapted for generating a plurality of activation beams, and wherein the beam optics is adapted to direct the plural activation beams to locations on the object arranged spaced apart from each other.

10. The system according to claim 9, wherein a number of the gas outlets being connected by the gas conduit system to a common gas inlet is greater than or equal to the number of the activation beams.

11. The system according to claim 1, wherein the at least one activation beam comprises at least one of an electron beam, an ion beam, and a photon beam.

12. The system according to claim 1, further comprising at least one detector to detect particles, in particular electrons, released from the object by the activation beam.

13. The system according to claim 1, wherein the beam optics comprises an objective for focussing the activation beam at the object.

14. The system according to claim 1, wherein the beam optics comprises a beam deflector to scan the activation beam across the object.

15. The system according to claim 1, wherein the plate of the stack arranged closest to the object comprises an electrically conductive surface and wherein the electrically conductive surface is electrically connected to a predetermined potential.

16. The system according to claim 1, further comprising a substance reservoir being connected in a gas conducting manner to the at least one gas inlet of the stack.

17. The system according to claim 16, wherein the substance reservoir contains a precursor gas, in particular organyles, metal organyles, oxygene containing compounds, nitrogen containing compounds, organic compounds, inorganic compounds, halogenid containing compounds or a combination therefrom.

18. The system according to claim 16, wherein the substance reservoir contains a purge gas, in particular an inert gas, such as at least one of He, Ne, Ar, Xe, Kr, and $N_2$.

19. The system according to claim 1, wherein the gas supply apparatus comprises at least two gas inlets and further comprises within the stack of plates a mixer for mixing two different gases entering via the at least two gas inlets into the gas conduit system.

20. The system according to claim 1, wherein the gas supply apparatus further comprises within the stack of plates a pressure sensor for measuring a pressure of gas contained in the gas conduit system.

21. A system for processing an object, the system comprising:
a gas supply apparatus for supplying gas to the object;
a beam source for generating at least one activation beam for activating the gas; and
a beam optics for directing the at least one activation beam to the object,
wherein the gas supply apparatus comprises a stack of a plurality of plates, being adjoined via their flat sides extending transverse to a beam direction of the activation beam, wherein the stack of plates allows traversal of the activation beam towards the object and wherein the stack of plates comprises at least one gas inlet and at least one gas outlet which gas outlet is arranged in a flat side of a plate of the stack which plate is arranged closest to the object, wherein the gas inlet and the gas outlet are connected with each other by a conduit system formed in the stack which conduit system comprises at least one conduit section extending from a location in the stack remote from a location of the traversal of the activation beam to a location close to the location of the traversal of the activation beam, wherein the gas supply apparatus comprises at least two gas inlets and further comprises within the stack of plates a mixer for mixing two different gases entering via the at least two gas inlets into the gas conduit system.

22. The system according to claim 21, wherein the stack comprises a first plate and a second plate both delimiting the conduit section over its entire length.

23. A system for processing an object, the system comprising:
a gas supply apparatus for supplying gas to the object;
a beam source for generating at least one activation beam for activating the gas; and
a beam optics for directing the at least one activation beam to the object,
wherein the gas supply apparatus comprises a stack of a plurality of plates, being adjoined via their flat sides extending transverse to a beam direction of the activation beam, wherein the stack of plates allows traversal of the activation beam towards the object and wherein the stack of plates comprises at least one gas inlet and at least one gas outlet which gas outlet is arranged in a flat side of a plate of the stack which plate is arranged closest to the object, wherein the gas inlet and the gas outlet are connected with each other by a conduit system formed in the stack which conduit system comprises at least one conduit section extending from a location in the stack remote from a location of the traversal of the activation beam to a location close to the location of the traversal of the activation beam, wherein the gas supply apparatus further comprises within the stack of plates a pressure sensor for measuring a pressure of gas contained in the gas conduit system.

24. The system according to claim 23, wherein the stack comprises a first plate and a second plate both delimiting the conduit section over its entire length.

25. A system for processing an object, the system comprising:
a gas supply apparatus for supplying gas to the object;
a beam source for generating at least one activation beam for activating the gas; and
a beam optics for directing the at least one activation beam to the object,
wherein the gas supply apparatus comprises a stack of a plurality of plates, being adjoined via their flat sides extending transverse to a beam direction of the activation beam, wherein the stack of plates allows traversal of the activation beam towards the object and wherein the stack of plates comprises at least one gas inlet and at least one gas outlet which gas outlet is arranged in a flat side of a plate of the stack which plate is arranged closest to the object, wherein the gas inlet and the gas outlet are connected with each other by a conduit system formed in the stack which conduit system comprises at least one conduit section extending from a location in the stack remote from a location of the traversal of the activation beam to a location close to the location of the traversal of the activation beam, wherein the beam source is adapted for generating a plurality of activation beams, and wherein the beam optics is adapted to direct the plural activation beams to locations on the object arranged spaced apart from each other.

26. The system according to claim 25, wherein a number of the gas outlets being connected by the gas conduit system to a common gas inlet is greater than or equal to the number of the activation beams.

27. A system for processing an object, the system comprising:
- a gas supply apparatus for supplying gas to the object;
- a beam source for generating at least one activation beam for activating the gas; and
- a beam optics for directing the at least one activation beam to the object,
- wherein the gas supply apparatus comprises a stack of a plurality of plates, being adjoined via their flat sides extending transverse to a beam direction of the activation beam, wherein the stack of plates allows traversal of the activation beam towards the object and wherein the stack of plates comprises at least one gas inlet and at least one gas outlet which gas outlet is arranged in a flat side of a plate of the stack which plate is arranged closest to the object, wherein the gas inlet and the gas outlet are connected with each other by a conduit system formed in the stack which conduit system comprises at least one conduit section extending from a location in the stack remote from a location of the traversal of the activation beam to a location close to the location of the traversal of the activation beam, wherein the gas inlet is arranged in a flat side of a plate of the stack arranged farthest from the object.

28. The system according to claim 27, wherein the plate of the stack arranged closest to the object comprises an electrically conductive surface and wherein the electrically conductive surface is electrically connected to a predetermined potential.

* * * * *